(12) United States Patent
Frank et al.

(10) Patent No.: US 6,983,433 B1
(45) Date of Patent: Jan. 3, 2006

(54) DIFFERENTIAL LINE PAIR IMPEDANCE ADJUSTMENT TOOL

(75) Inventors: Mark D. Frank, Longmont, CO (US); Jerimy C. Nelson, Fort Collins, CO (US); Karl J. Bois, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 409 days.

(21) Appl. No.: 10/366,208

(22) Filed: Feb. 13, 2003

(51) Int. Cl.
*G06F 17/50* (2006.01)

(52) U.S. Cl. .......................................... 716/5; 716/4
(58) Field of Classification Search ................ 716/2, 716/4–9, 12
See application file for complete search history.

(56) References Cited

U.S. PATENT DOCUMENTS

| | | | |
|---|---|---|---|
| 6,260,181 B1 * | 7/2001 | Inoue | 716/10 |
| 6,381,730 B1 * | 4/2002 | Chang et al. | 716/5 |
| 6,530,062 B1 * | 3/2003 | Liaw et al. | 716/2 |
| 6,539,062 B1 * | 3/2003 | Grabb et al. | 375/261 |
| 2004/0113654 A1 * | 6/2004 | Lundberg | 326/30 |

* cited by examiner

*Primary Examiner*—Stacy A. Whitmore
*Assistant Examiner*—Nghia M. Doan

(57) ABSTRACT

A computer-implemented method is disclosed for adjusting impedance. A list of differential line pairs in a circuit design database is searched through for a target differential line pair, where the target differential line pair is flagged as having an incorrect characteristic impedance. A position in a circuit layout described in said circuit design database of at least one line in the differential line pair is adjusted to correct the characteristic impedance.

20 Claims, 20 Drawing Sheets

FIG. 13A   FIG. 13B

DIFFERENTIAL LINE PAIR IMPEDANCE ADJUSTMENT TOOL

BACKGROUND

Explosive growth in electronics technology has resulted in electronic devices used all around us in seemingly every facet of life. For example, communications equipment, toys, computers, automobiles, personal digital assistants (PDAs), household appliances, medical equipment, etc., all include increasingly powerful electronic circuits. As electronic devices become more powerful, however, their design and manufacture has become more complex and sensitive, particularly as their speed increases.

Although the design and manufacture of electronic circuits may be carried out in a number of ways, two steps in the design process are practically universal: first, the logical or functional design of the circuits, and second, the physical design of the circuits. In the first step, a circuit design is created in which circuit elements are selected and interconnected to implement the desired functionality of the circuit. The result of this functional design step is a logical circuit design file describing the interconnections in the circuit, such as "L1_pin A should connect to L2_pin B".

The second of these two design steps is to generate a physical circuit layout from the logical circuit design for the desired product, such as an integrated circuit (IC), an IC package, a printed circuit board, etc. The circuit layout can be used to form a mask which can be provided to a foundry for fabrication. For example, the circuit layout describes the conductive lines or traces including their width, shape and position, and the conductive vias which connect the traces on different circuit layers.

Many electronic design automation (EDA) software packages are available to aid in these two steps of electronic circuit design, including place-and-route tools and package design tools such as Allegro and Advanced Package Designer (APD), available from Cadence Design Systems, Inc. of San Jose, Calif. Allegro enables a designer to place (assign locations to circuit elements) and route (connect circuit elements with traces) a printed circuit board based on a logical circuit design and constraints specified by the designer. Similarly, APD is a software application that enables a package designer to design IC packages, laying out components and connections based on constraints or design rules specified by the designer. Many other EDA software packages are also available from other companies.

The design constraints specified by the designer may be used to indirectly control some physical and electrical characteristics of the product being designed. For example, the constraints may include available trace widths, minimum trace spacing, minimum and maximum trace length, etc., which impact physical and electrical characteristics such as signal delay and distortion. However, characteristic impedance values for traces and vias are not always directly controlled and may vary from the desired value. Improper characteristic impedance values may cause errors due to signal distortion such as reflection or ringing, particularly in high-speed circuits that are sensitive to signal distortion.

SUMMARY

In one exemplary embodiment, a computer-implemented method adjusts impedance. A list of differential line pairs in a circuit design database is searched through for a target differential line pair, where the target differential line pair is flagged as having an incorrect characteristic impedance. A position in a circuit layout described in said circuit design database of at least one line in the differential line pair is adjusted to correct the characteristic impedance.

In another exemplary embodiment, an apparatus for adjusting differential line pair impedance comprises at least one computer readable medium with computer readable program code stored thereon. The computer readable program code comprises program code for reading a desired modal characteristic impedance value for the differential line pair and for reading properties of the differential line pair from a circuit design database. The computer readable program code also comprises program code for adjusting a position of the differential line pair in a circuit layout defined in the circuit design database to minimize a difference between a calculated modal characteristic impedance of the differential line pair and the desired modal impedance value.

In another exemplary embodiment, an apparatus for adjusting differential line pair impedance comprises means for locating a differential line pair in a circuit design database having an incorrect impedance and means for adjusting a position of the differential line pair in a circuit layout defined in the circuit design database to minimize an odd mode characteristic impedance error of the differential line pair.

BRIEF DESCRIPTION OF THE DRAWINGS

Illustrative embodiments are shown in the accompanying drawings, in which:

FIGS. 13A–13C are two-dimensional cross-sections of the three-dimensional window of FIG. 11, taken at the cross-section lines of FIG. 12;

DESCRIPTION

Multiple tools are disclosed herein for verifying and adjusting the impedance of connective elements in an electrical circuit such as an integrated circuit (IC), an IC package, a printed circuit board (PCB), etc. The tools for verifying and adjusting impedance are not limited for use with any particular type of electrical circuit such as the IC package or PCB discussed herein. The tools are embodied in software packages executed by a computer, either within an electronic design automation (EDA) software package or externally. The impedance verification and adjustment tools read a circuit design database describing the connections and physical properties of an electrical circuit. From these and other inputs to be described below, the impedance verification and adjustment tools can flag and correct or minimize deviations from desired impedance levels.

The following patent applications have been filed concurrently herewith and are incorporated by reference herein for all that they contain:

"Signal Via Impedance Verification Tool", Ser. No. 10/366,279;

"Signal Via Impedance Adjustment Tool", Ser. No. 10/365,831;

"Signal Line Impedance Verification Tool", Ser. No. 10/365,848;

"Signal Line Impedance Adjustment Tool", Ser. No. 10/366,135;

"Differential Line Pair Impedance Verification Tool", Ser. No. 10/366,134;

"Differential Via Pair Impedance Verification Tool", Ser. No. 10/366,205; and

"Differential Via Pair Impedance Adjustment Tool", Ser. No. 10/366,489.

Figure 1:
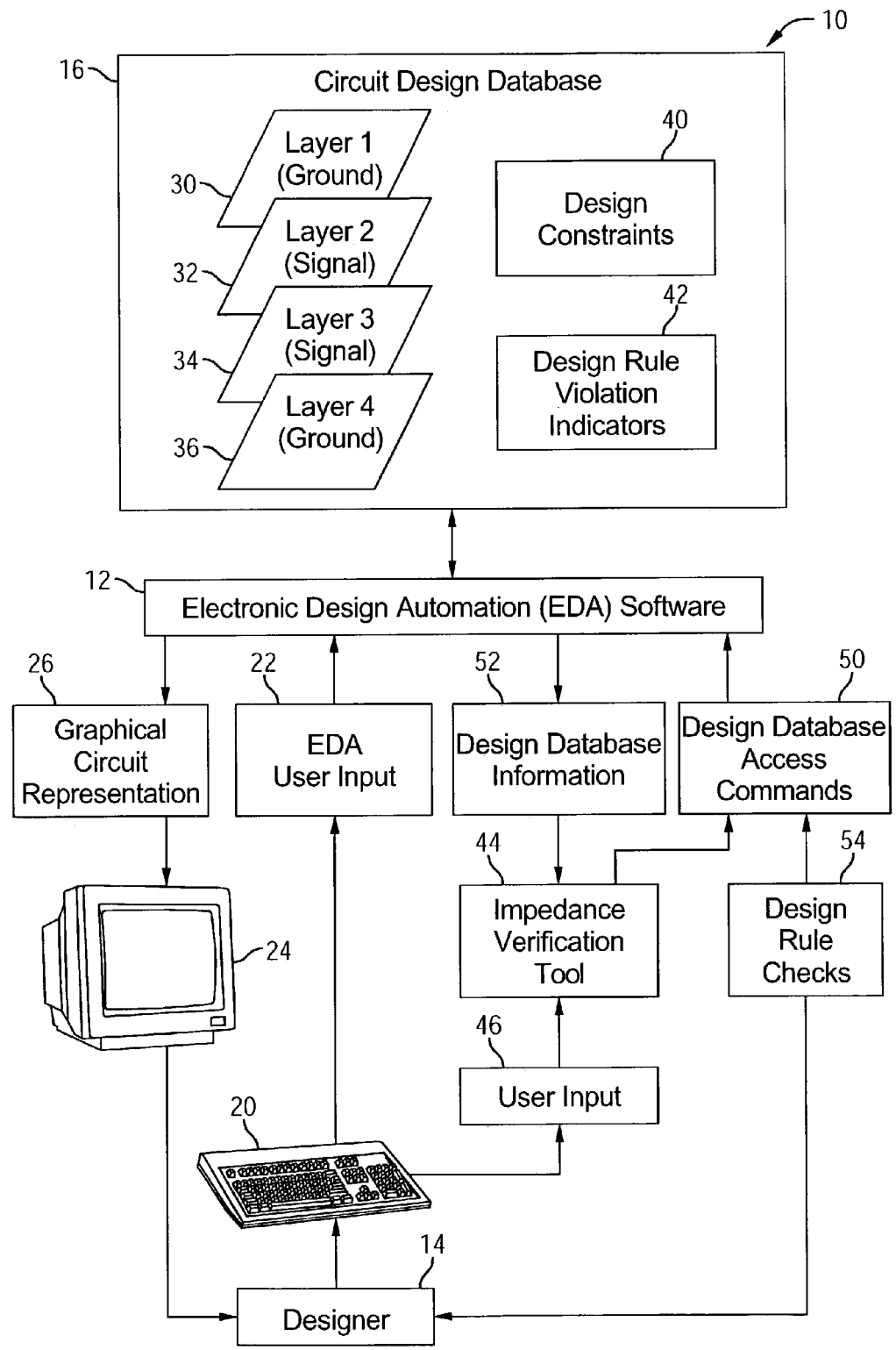
FIG. 1 is a block diagram of an exemplary system for verifying impedance in an electrical circuit.

An exemplary system 10 for verifying impedance in an electrical circuit (such as an IC, an IC package, or a PCB) is illustrated in FIG. 1. This exemplary system 10 for verifying impedance is executed as part of an EDA software package 12. For example, the EDA software package 12 may comprise the Advanced Package Designer (APD) package design software available from Cadence Design Systems, Inc. of San Jose, Calif. However, it is important to note that the tools for verifying and adjusting impedance are not limited to use with an EDA package 12, but may be executed independently using stored circuit information such as a circuit design database.

A human circuit or package designer 14 creates and edits a model of the circuit product using the EDA software 12. The designer 14 enters information through an interface such as a keyboard 20 or other input device to provide input 22 to the EDA software 12. Feedback is provided to the designer 14 on a monitor 24 or other output device. For example, if the designer 14 is creating a circuit layout or package, the end product is a design database 16 describing the physical layout of the circuit, such as the position, size and shape of traces, vias, component connection pads, etc. In this case, the monitor 24 may display a textual listing of the design database 16 or a graphical display of the circuit layout, displayed on a two-dimensional grid. Typical circuits include multiple layers 30, 32, 34 and 36, including layers 30 and 36 having ground planes, and layers 32 and 34 having signal traces, so the designer may view and edit any desired layer. Vias, which are vertical conductors, are used to connect traces between multiple layers, whereas traces (horizontal or radial conductors) are used to connect components on a single layer.

Various formats exist for a design database 16. The format and contents of the design database 16 will therefore not be described in detail herein, as the impedance verification and adjustment tools may be adapted for use with any system now existing or that may be developed in the future. The exemplary design database 16 is generated from a logical circuit design and other inputs such as design constraints 40, and comprises circuit layout information and other information such as indications of design rule violations, or design rule checks (DRCs) 42.

After a circuit has been designed, including the logical and physical layout (stored in the design database 16), the designer 14 invokes the impedance verification tool 44, providing user input 46 to guide the impedance checks as will be described in detail below. In this exemplary embodiment, the impedance verification tool 44 runs on the EDA software 12. For example, the impedance verification tool 44 of this exemplary embodiment may be implemented using a script language provided with the EDA software 12. Access to the design database 16 is therefore provided through the EDA software 12 using design database access commands 50. The impedance verification tool 44 issues design database access commands 50 to the EDA software 12, which accesses the desired portions of the design database 16. The EDA software 12 then provides the requested design database information 52 to the impedance verification tool 44.

The impedance verification tool 44 searches the design database 16 and uses numerical formulas or an analytical field solver to calculate the impedance of specified vias or traces (or sections of traces). The resulting impedance is compared with the desired impedance value, and if the impedance is not within the specified tolerance, the impedance verification tool 44 flags the error.

In this exemplary embodiment, the impedance verification tool 44 attaches a Design Rule Check (DRC) 54 to the faulty trace or via, either adding the DRC 54 directly to the design database 16 or passing the information through the EDA software 12 using the design database access commands 50.

Figure 2:
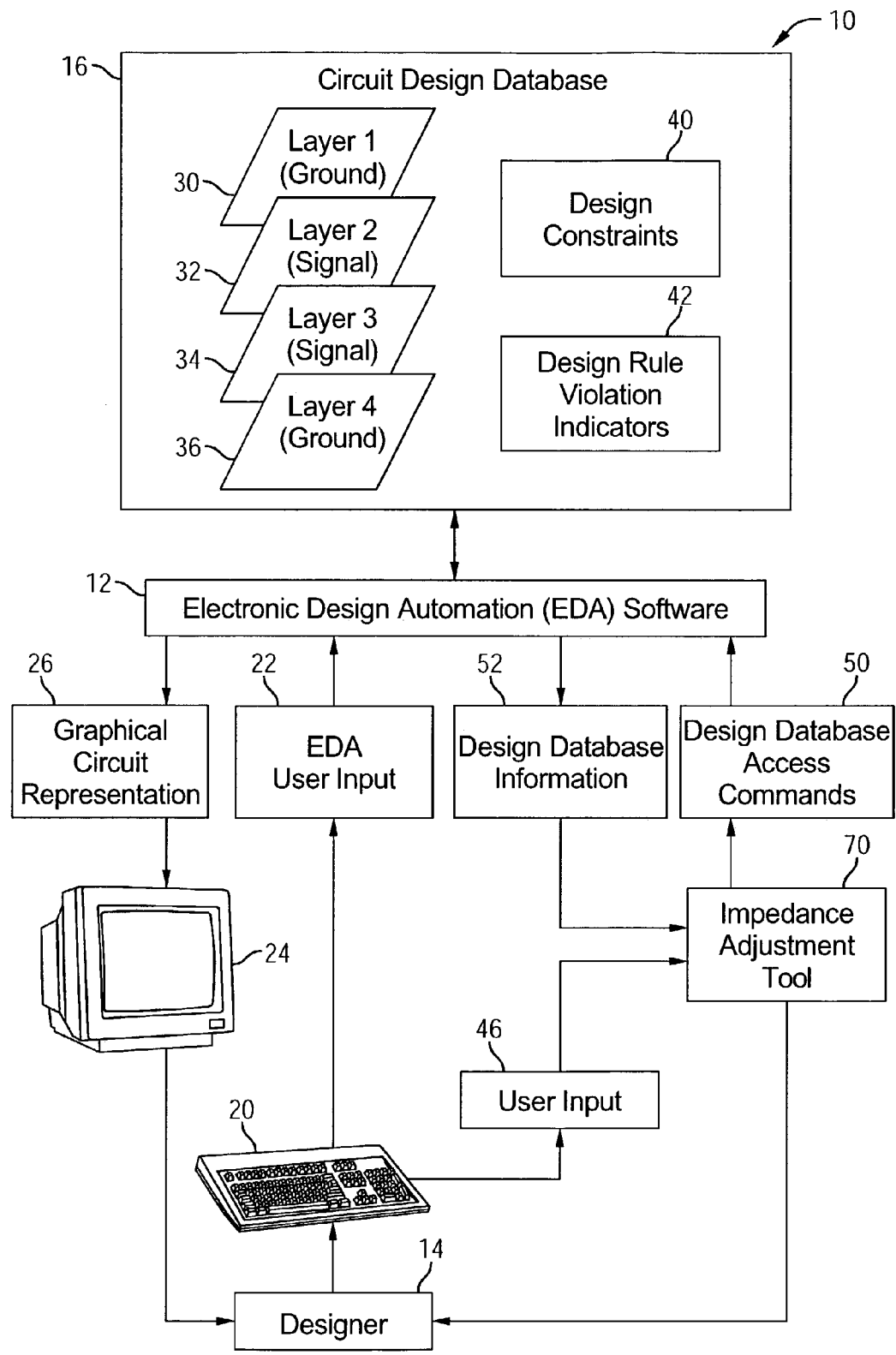
FIG. 2 is a block diagram of an exemplary system for adjusting impedance in an electrical circuit.

Once the impedance errors have been flagged, an impedance adjustment tool 70 may be executed to correct or minimize the errors, as illustrated in FIG. 2 (in which like numbers indicate like elements). Again, in this exemplary embodiment the impedance adjustment tool 70 is implemented as a script under the EDA software 12, accessing the design database 16 through design database access commands 50 and design database information 52 passed between the EDA software 12 and the impedance adjustment tool 70. Alternatively, the impedance adjustment tool may be executed independently and access the design database 16 directly.

The impedance adjustment tool 70 searches the design database 16 for impedance DRCs, and, under designer control through the user input 46, corrects or minimizes the impedance errors in the circuit design. Various techniques may be used by the impedance adjustment tool 70 to control the impedance of traces or vias, as will be described below with reference to the various impedance adjustment tools.

Figure 3:
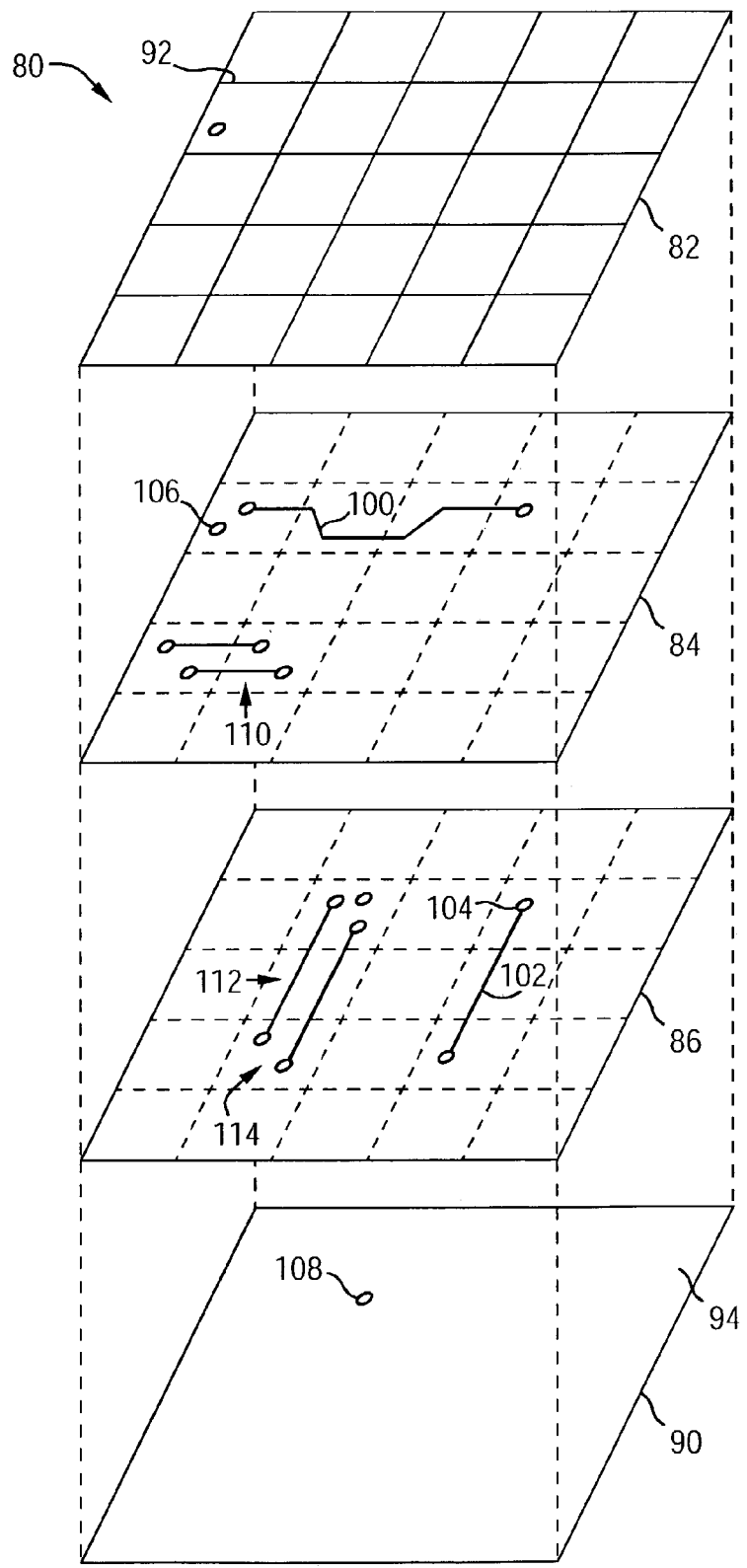
FIG. 3 is a perspective view of an exemplary circuit layout having four layers, including two ground plane layers and two signal layers.

Throughout the description of the impedance verification and adjustment tools, various examples will be provided to illustrate the operation more clearly. Referring now to FIG. 3, an exemplary circuit layout 80 is illustrated having multiple layers 82, 84, 86 and 90 and including traces and vias, both single and differential pairs. It should be noted that the circuit layout 80 is not drawn to scale, and only relevant features are included to illustrate the operation of the impedance verification and adjustment tools. It should also be noted that the arrangement of layers and elements on the layers is purely exemplary. Grid lines are provided on the two center layers 84 and 86 to aid in correlating features between layers.

Ground planes may be provided on one or more layers 82 and 90, either as a grid of ground lines 92 (illustrated by solid grid lines in the top layer 82 of FIG. 3) or a solid plane 94. An exemplary signal contains a trace 100 and 102 on two layers 84 and 86, connected by a via 104. Ground vias (e.g., 106 and 108) are often placed near signal vias to minimize signal distortion by providing a good return path for the signal. An exemplary differential signal contains differential traces 110 and 112 on two layers 84 and 86, connected by a differential via pair 114. Impedance verification and adjustment tools are described herein for verifying and adjusting the impedance on traces and vias, for both single conductors and differential pairs such as those illustrated in FIG. 3.

The impedance verification and adjustment tools will now be described in more detail in the following order: Signal Via Impedance Verification Tool, Signal Via Impedance Adjustment Tool, Signal Line Impedance Verification Tool, Signal Line Impedance Adjustment Tool, Differential Line Pair Impedance Verification Tool, Differential Line Pair Impedance Adjustment Tool, Differential Via Pair Impedance Verification Tool, and Differential Via Pair Impedance Adjustment Tool.

Signal Via Impedance Verification Tool

The signal via impedance verification tool (e.g., 44) searches through a circuit design database 16. As discussed above, this design database may comprise layout information containing the names, sizes, location and layer, etc., of vias that carry signals in the electrical circuit. The design database also contains information about ground vias and other elements in the circuit. The design database may be created by EDA software for logical circuit design followed by EDA software for physical circuit layout such as the APD package designer.

In this exemplary embodiment, the signal via impedance verification tool runs on top of the EDA software 12 as a script. For example, if the EDA software 12 comprises the APD package designer, the signal via impedance verification tool may be implemented as a script using the "Skill" script language and executed within the APD design environment. In this example, the circuit model access commands issued by the signal via impedance verification tool may comprise Skill commands issued to the APD package designer. Alternatively, the signal via impedance verification tool may be implemented as a standalone software application or as a script in another language such as Perl, as desired or as needed to operate with other EDA software. The exemplary embodiment being described herein comprises a combination of a Skill script, a Perl script, and an analytical field solver such as the Raphael Interconnect Analysis software available from Synopsys, Inc., of Mountain View, Calif.

Figure 4:
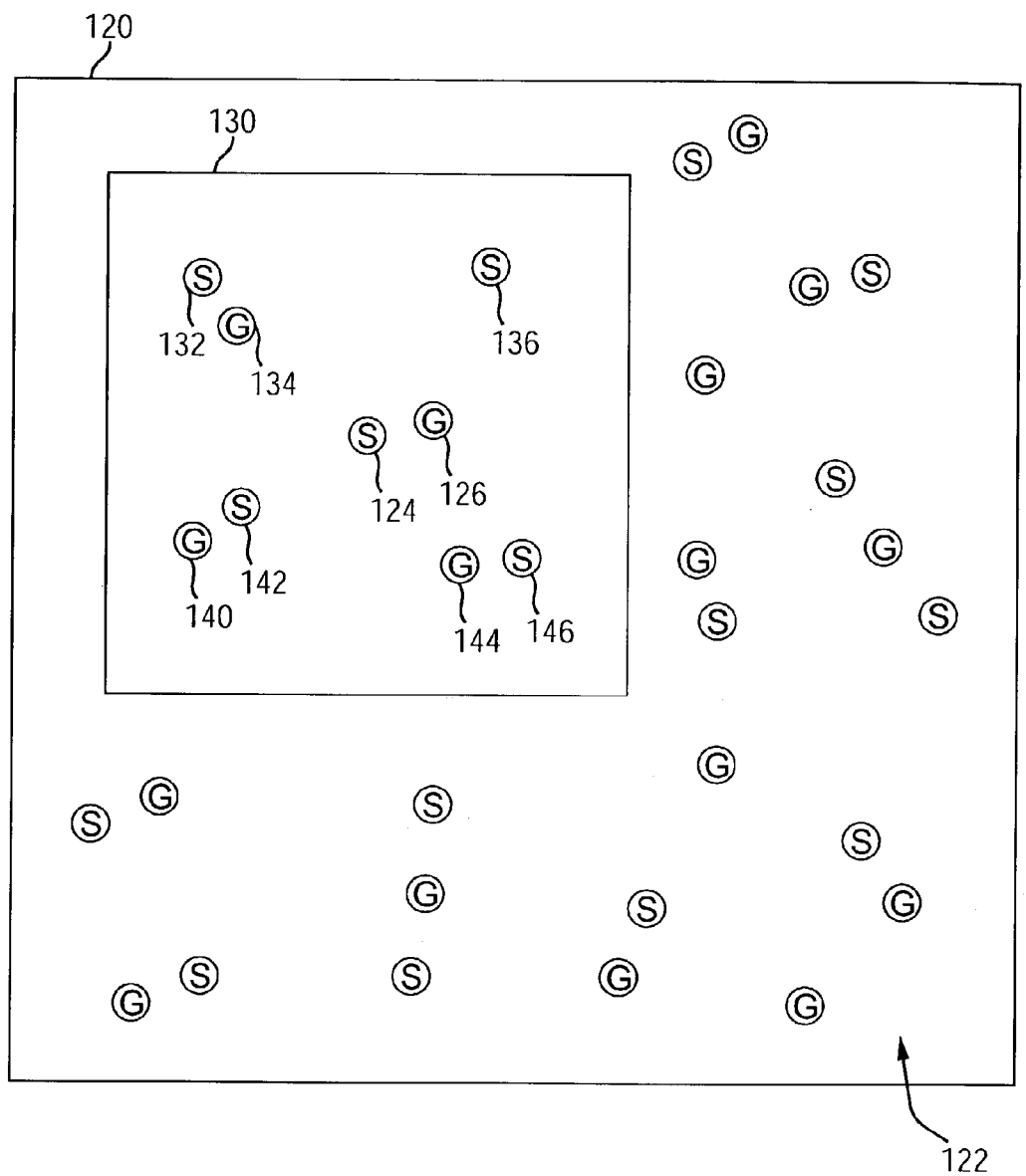
FIG. 4 is a top view of a portion of a layer in an exemplary circuit illustrating a target signal via for which impedance will be verified.

The signal via impedance verification tool calculates the characteristic impedance of one or more vias in the design database and compares the calculated characteristic impedance against the desired characteristic impedance. If a calculated characteristic impedance differs from the desired characteristic impedance or is not within a desired tolerance, the fault is flagged for later correction. Referring now to FIG. 4, a portion of an exemplary circuit layout is shown to illustrate the operation of the signal via impedance verification tool. (Only vias are shown in this view to simplify the drawing and explanation, omitting traces and other elements.) Note that the placement of signal and ground vias in FIG. 4 is purely exemplary and is not intended to represent an actual circuit layout or to limit the signal via impedance verification tool disclosed herein.

In this exemplary embodiment, the impedance calculations made by the signal via impedance verification tool take into account parameters from a single layer only, so FIG. 4 is a top view of a single layer 120. The layer 120 contains multiple vias 122 including at least one signal via (e.g., 124). Signal vias are those vias that carry signals during circuit operation, and are marked with an "S" in FIG. 4 (e.g., 124). Ground vias are connected to an electrical ground such as a ground plane 82 or 90, and are marked with a "G" in FIG. 4 (e.g., 126).

Figure 5:
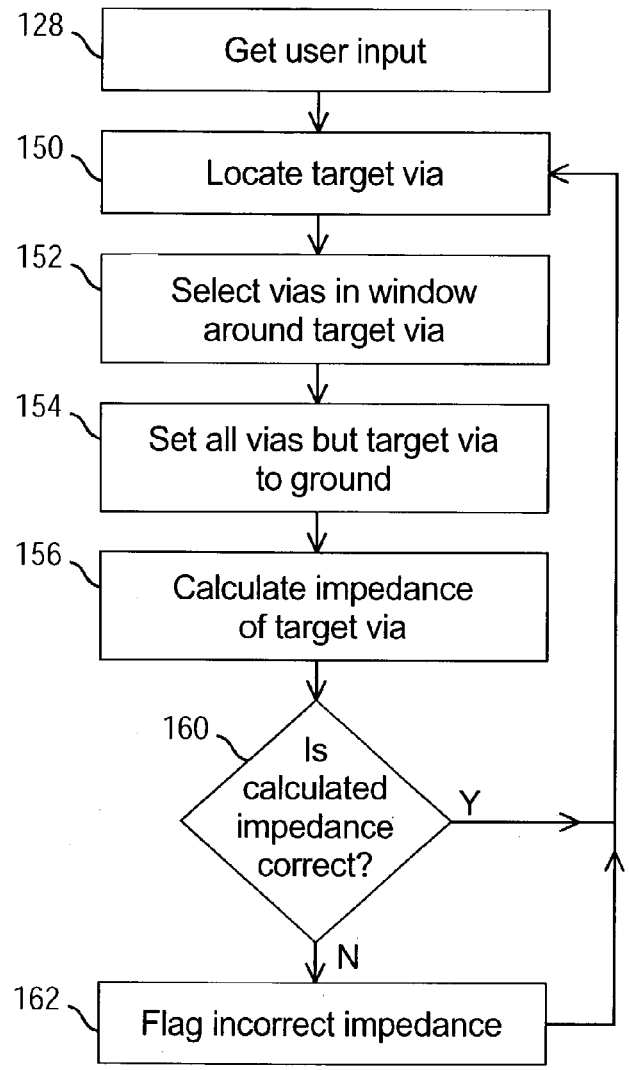
FIG. 5 is a flowchart summarizing an exemplary operation for verifying signal via impedance.

Operation of the signal via impedance verification tool will now be described with reference to the circuit layout of FIG. 4 and the flowchart of FIG. 5. The flowchart of FIG. 5 illustrates verification of signal via impedance. The signal via impedance verification tool obtains 128 any needed user input that is not hard-coded into the tool. The inputs used by the signal via impedance verification tool depend upon the technique used in calculating impedance. For example, the following items may be entered as user input in the present exemplary embodiment:

Target vias

Window size

Desired impedance or tolerance

Material properties

The target vias are those vias for which impedance will be calculated. This input may be entered in any desired manner, such as the name of the via in the design database, or the name of the net of which the via is a part, and the layers on which vias in a specified net will be examined, or all vias in the design database, or all vias on specified signals, etc.

The window size determines the scope of the impedance calculation. When calculating impedance of a target signal via, one of the factors considered is the effect of neighboring vias on the impedance of the target via. As the distance increases between the target via and neighboring vias, the effect of the neighboring vias on the target via impedance decreases. Therefore, the designer 14 may specify a window 130 to limit the area in which neighboring vias are considered in the impedance calculation for a target via. In the circuit layout illustrated in FIG. 4, nine vias 124, 126, 132, 134, 136, 140, 142, 144, and 146 are located in the window 130. All other vias on the layer 120 are outside the window 130 and are therefore excluded from the impedance calculation.

The window size of the exemplary embodiment is specified as a size around the target via (e.g., 124). Thus, for each target via (e.g., 124), the window is centered around its corresponding target via (e.g., 124). Alternatively, the window location and dimensions may be specified for a given target via.

The window may have any suitable shape, such as circular, rectangular, etc.

Note that in this exemplary embodiment, the impedance calculations for a signal via take into account only parameters from a single layer, so the window is limited to a single layer as well. However, the signal via impedance verification tool is not limited to any particular means for controlling the scope of the impedance calculation, just as it is not limited to any particular technique for calculating impedance.

The desired characteristic impedance for one or more target vias may also be entered, either as an exact impedance value or as an acceptable tolerance around a desired characteristic impedance value. For example, the designer 14 may specify a desired characteristic impedance of 50 ohms with an acceptable tolerance of plus or minus 10 percent. Any actual calculated characteristic impedance within 45–55 ohms would therefore be acceptable, and any calculated characteristic impedance outside this range would be flagged as an error.

The designer 14 may also specify the material properties, such as the dielectric constant or electric permittivity epsilon ($\epsilon$) and the magnetic permeability mu ($\mu$), if needed for the impedance calculation and if not hard-coded into the signal via impedance verification tool. The material properties are the characteristics of the material in which the vias are embedded, such as the substrate of the IC or PCB.

Having any needed inputs, the signal via impedance verification tool locates 150 the first target via (e.g., 124) for which impedance is to be calculated. The other vias 126, 132, 134, 136, 140, 142, 144, and 146 on the layer 120 and in the window 130 are selected 152 and are set 154 to ground. Note that in this example, four vias 126, 134, 140 and 144 are ground vias, so the remaining neighboring signal vias 132, 136, 142 and 146 are set 154 to ground for the impedance calculation.

With this information, the signal via impedance verification tool calculates 156 the characteristic impedance $Z_0$ of the target via 124. The calculated characteristic impedance is compared 160 with the desired characteristic impedance, and if the calculated characteristic impedance is incorrect or does not fall within the specified tolerance, the target via 124 is flagged 162 as having an incorrect characteristic impedance.

The target via 124 may be flagged 162 in any desired manner, as discussed above. For example, the signal via impedance verification tool may indicate the error directly to the designer 14, may store a list of impedance errors separately, may place a DRC directly in the circuit design database, or may indicate the error to the EDA software 12, etc., as desired.

After the impedance is calculated 156 and verified 160 for the target via 124 and any errors have been flagged 162, the next target via may be located 150 and the process repeated until all desired vias have checked.

Figure 6:
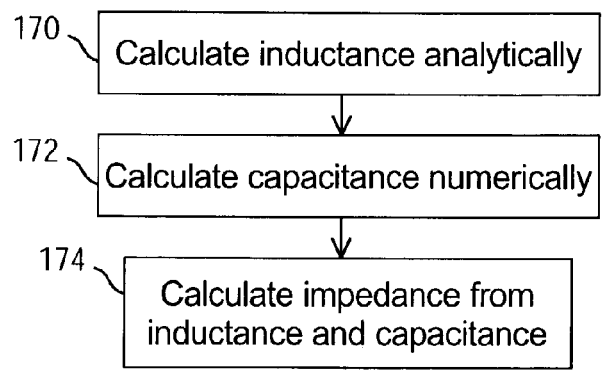
FIG. 6 is a flowchart summarizing an exemplary impedance calculation in an embodiment of the signal via impedance verification tool.

Referring now to FIG. 6, the impedance calculation in the exemplary signal via impedance verification tool will be described in more detail. The inductance L of the target via 124 is calculated 170, for example, analytically using an analytical field solver such as the Raphael Interconnect Analysis software. The capacitance C of the target via 124 is then calculated 172 numerically using a formula such as $C=(\mu_0\epsilon_0\mu_r\epsilon_r)/L$. Alternatively, the capacitance C may be calculated first, followed by the inductance. The characteristic impedance $Z_0$ is then calculated 174 as the square root of the inductance L over the capacitance C.

Alternative impedance calculations may include calculating impedance numerically using an equation or using a lookup table based on potential numbers and positions of neighboring vias, although the accuracy is reduced.

Figure 7:
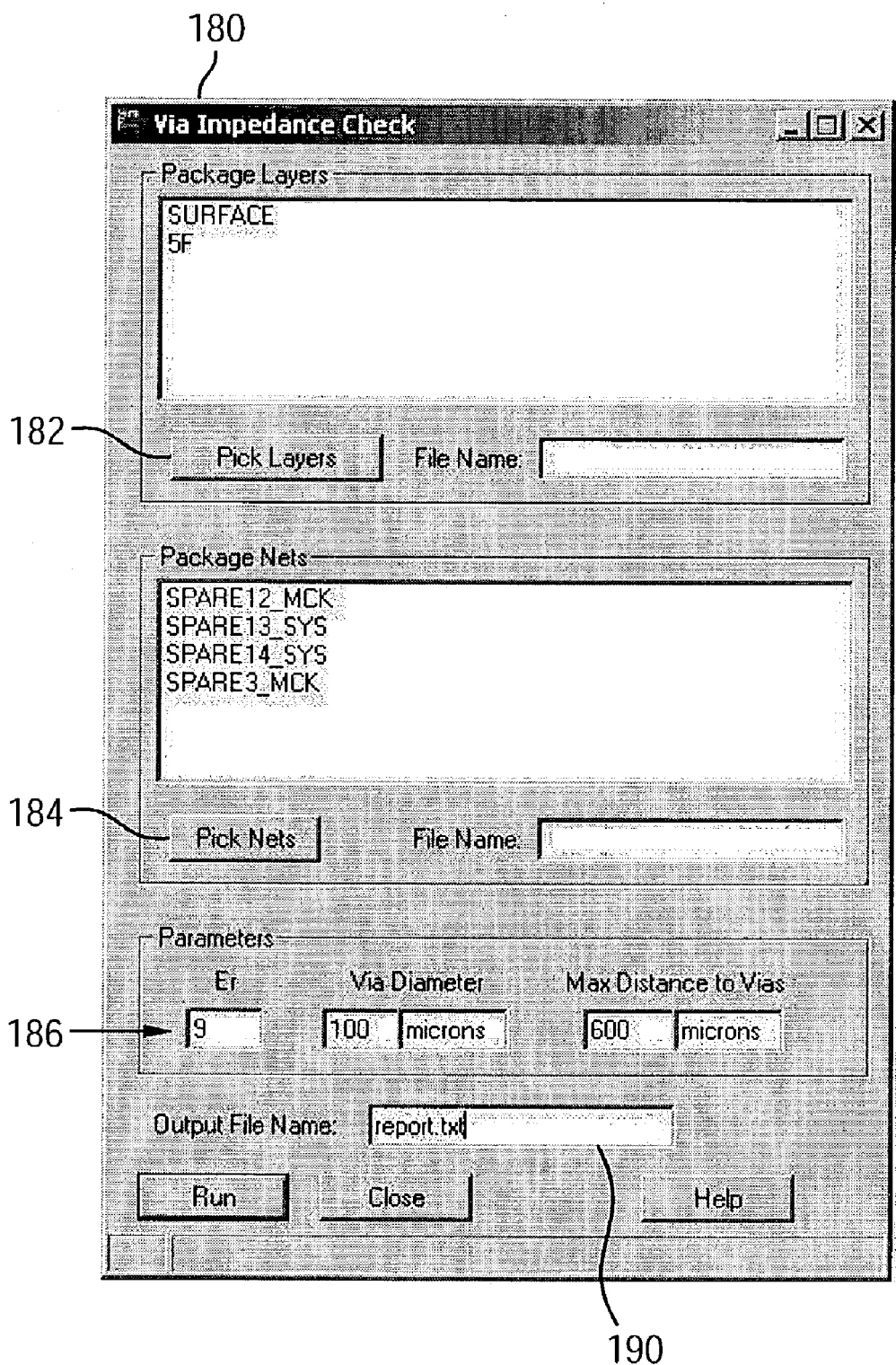
FIG. 7 is a screenshot of an exemplary control window for an embodiment of the signal via impedance verification tool.

As discussed above, the signal via impedance verification tool may be implemented in any suitable manner according to the EDA software 12 being used, or according to the operating system and design database format for standalone execution. The exemplary embodiment includes a Skill script, a Perl script, and invocation of the Raphael software. The Skill script interfaces with the APD package designer, obtaining user input through a control window and reading information from the design database about the target vias and neighboring vias. An exemplary control window 180 to obtain user input in the Skill script is illustrated in FIG. 7. The control window 180 enables the designer 14 to select layers 182 on which via impedance calculations will be performed, to identify 184 nets containing target vias, and to enter 186 window size and material properties. In the exemplary embodiment, the desired impedance and tolerance is specified as an input parameter to the Perl script.

The Skill script stores the resulting user input and via information from the design database in a text file 190 such as the following exemplary listing:

| netname | Layer | x | y | Zo |
|---------|-------|------|------|---------|
| signal1 | layer4 | 1600 | 5170 | 20.7271 |
| signal2 | layer6 | 3980 | 236  | 15.3524 | window diel=9.90; x1=0.00; y1=0.00; x2=500.00; y2=500.00; cl name=gnd_1; cx=70.00; cy=80.00; r=100.00; volt=0.0; circ1 name=signal1; cx=160.00; cy=170.00; r=100.00;
volt=1.0;
merge gnd_1;
options iter_tol=1e-5; set_grid=10000; fac_regrid=1.414; max_regrid=5;
regrid_tol=0.5; unit=1e-6;
z0 signal1;

| | | | | | |
|---|---|---|---|---|---|
| signal_1 | −6978.51 | 2765.07 | 100.0 | | |
| gnd_0 | −7241.85 | 2765.07 | 100.0 | | |
| gnd_1 | −6978.51 | 2501.73 | 100.0 | | |
| gnd_2 | −6978.51 | 3028.41 | 100.0 | | |
| window | 9.0 −7378.51 | 2365.07 | −6578.51 | 3165.07 | SURFACE |
| signal_2 | −6978.51 | 2765.07 | 100.0 | | |
| gnd_0 | −7241.85 | 2765.07 | 100.0 | | |
| gnd_1 | −6978.51 | 2501.73 | 100.0 | | |
| gnd_2 | −6978.51 | 3028.41 | 100.0 | | |
| gnd_3 | −6715.17 | 2501.73 | 100.0 | | |
| gnd_4 | −6715.17 | 2765.07 | 100.0 | | |
| gnd_5 | −6715.17 | 3028.41 | 100.0 | | |
| window | 9.0 −7378.51 | 2365.07 | −6578.51 | 3165.07 | 5–6F |
| signal_3 | 3028.41 | 6715.17 | 100.0 | | |
| gnd_0 | 3291.75 | 6978.51 | 100.0 | | |
| gnd_1 | 3291.75 | 6715.17 | 100.0 | | |
| gnd_2 | 2765.07 | 6715.17 | 100.0 | | |
| gnd_3 | 2765.07 | 6978.51 | 100.0 | | |
| gnd_4 | 2765.07 | 6451.83 | 100.0 | | |
| gnd_5 | 3291.75 | 6451.83 | 100.0 | | |
| gnd_6 | 3028.41 | 6978.51 | 100.0 | | |
| window | 9.0 2628.41 | 6315.17 | 3428.41 | 7115.17 | SURFACE |

The text file produced by the Skill script under the APD package designer is processed by the Perl script to prepare it for the Raphael analytical field solver. The Perl script is listed at the end of the present Description. The Perl script translates the text file produced by the Skill script into another text file for Raphael. Raphael produces an output containing the calculated impedance values. The Skill script or another program is then invoked to parse the Raphael output and flag impedance errors by placing DRC's at each of the signal vias that failed in the design database. The parameters used to calculate the via impedance that led to a DRC may also be stored for the signal via impedance adjustment tool. As discussed above, the signal via impedance verification tool may be implemented in any suitable manner, such as in a single integrated program.

Signal Via Impedance Adjustment Tool

Once impedance errors are flagged in a suitable manner, such as in the design database or in a separate file, a signal via impedance adjustment tool may be invoked to resolve impedance DRCs by correcting or minimizing the impedance error of a signal via. The signal via impedance adjustment tool may be implemented in any suitable manner, as with the signal via impedance verification tool, such as in a Skill script for use within the APD package designer. The signal via impedance adjustment tool uses a recursive algorithm to vary the position of one or more ground vias near the target signal via with the incorrect impedance. The ground via to be adjusted typically serves as a return path for the signal via, but the signal via impedance adjustment tool is not limited to this configuration. The position of the ground via is adjusted within a restricted spatial arrangement to better match the desired characteristic impedance of the transmission line formed by the signal via and the return path ground via. The characteristic impedance may be calculated using either closed form formulae, a generic field solver, or a lookup table, etc. If an exact match to the desired characteristic impedance does not exist within the restricted spatial arrangement, the signal via impedance adjustment tool will attempt to minimize the impedance error by locating the best possible position for the ground via.

Figure 8:
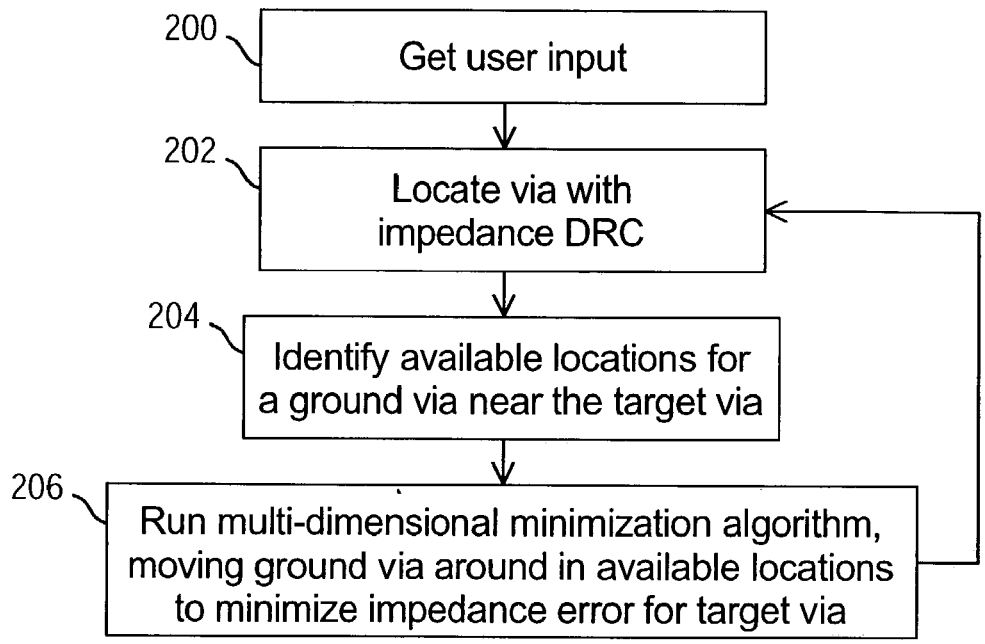
FIG. 8 is a flowchart summarizing an exemplary operation for adjusting signal via impedance.

The operation of the signal via impedance adjustment tool is illustrated in the flowchart of FIG. 8. User input is obtained 200 as in the signal via impedance verification tool described above, such as the window size, material properties, desired target vias, and the desired characteristic impedance or tolerance. This information may be stored by the signal via impedance verification tool or may be entered by the designer 14. A signal via with an impedance error is located 202, either by automatically scanning through the list of signal vias to be adjusted for those with impedance DRCs in the design database, or manually. For example, the EDA software 12 may display a graphical circuit representation 26, including icons indicating a DRC. The designer 14 would then be able to select the desired DRC icon for a signal via having an incorrect impedance to manually initiate the impedance adjustment process.

Figure 9:
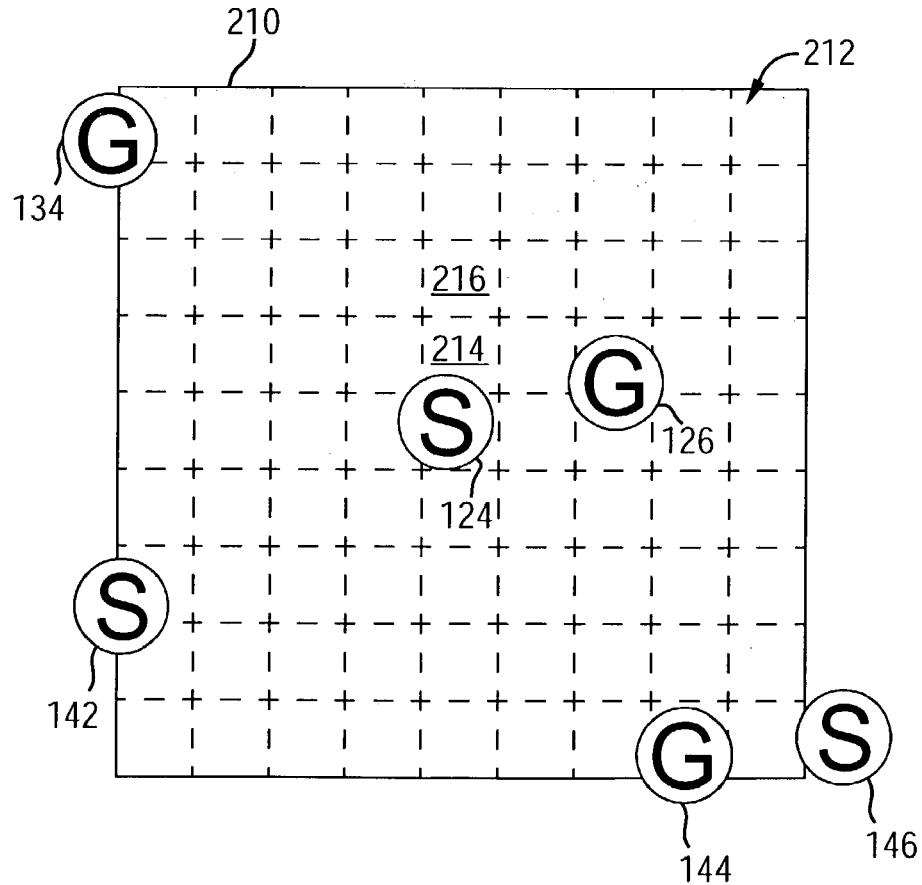
FIG. 9 is a top view of a portion of a layer in an exemplary circuit illustrating potential ground via locations to adjust the impedance of a signal via.

The spatial arrangement for a ground via near the signal via is then restricted by identifying acceptable locations in which the ground via may be placed. FIG. 9 contains a top view of a portion of the circuit layer 120 of FIG. 4, centered on a target signal via 124 having an incorrect impedance. Note that a ground via 126 is placed near the target via 124 to provide a return path for the signal. (If a ground via 126 does not already exist near the target via 124, the signal via impedance adjustment tool may place a ground via 126 during the impedance adjustment process.)

A restricted area 210 may be selected in which the position of the ground via 126 may be adjusted. In this exemplary embodiment, note that the restricted area 210 is smaller than the original window 130 to simplify the drawing and explanation. However, the restricted area 210 may correspond to the original window 130 or to any other desired size. If the original window 130 was relatively large, it may slow the signal via impedance adjustment tool and allow for checking of potential locations for the ground via 126 that are simply too distant from the target via 124 to have the desired effect, so some limitation of the size of the restricted area 210 may be desirable.

The signal via impedance adjustment tool identifies 204 available locations for the ground via 126 near the target via 124. This may be performed by establishing a grid 212 in the restricted area 210 around the target via 124, and marking grid locations as suitable or not for the ground via 126, or with a scaled representation of how suitable the location would be for the ground via 126. For example, part of the user input may indicate how close a ground via may be to a trace (not shown) or to other vias, either ground or signal. Accordingly, grid locations (e.g., 214) very near traces or other vias may be marked as unsuitable for the ground via 126. Other grid locations that would not cause problems according to the user input (e.g., 216) may be marked as suitable for the ground via 126. The marking of grid locations as suitable or unsuitable enables the signal via impedance adjustment tool to adjust the position of the ground via 126 without requiring the EDA software 12 to become involved in re-placing the ground via 126, greatly speeding and simplifying the impedance adjustment process.

The signal via impedance adjustment tool then runs 206 a multi-dimensional minimization algorithm which adjusts the position of the ground via 126 within the grid locations marked as suitable, recalculating the impedance of the target signal via 124 after each adjustment. A score may be assigned to each configuration, with those having the best impedance given the lowest scores. Thus, the minimization algorithm seeks a location on the grid resulting in the lowest score, corresponding to the best match of the calculated characteristic impedance to the desired characteristic impedance.

In an alternative embodiment, the multi-dimensional minimization algorithm may try every location for the ground via 126 in the restricted area 210 or the original window 130. In this case, the algorithm would assign relatively huge scores to those locations identified as unsuitable to prevent the ground via 126 from being placed in an unsuitable location.

The characteristic impedance of the target via 124 is recalculated for each position of the ground via 126. The characteristic impedance may be calculated in the same manner as described above with respect to the signal via impedance verification tool.

After the impedance adjustment process is complete for the target signal via 124, the next signal via having an impedance DRC may be adjusted.

The scale of the grid 212 may be varied as desired, from a coarse grid in which a single grid location may entirely contain a ground via, to a fine grid in which a ground via occupies multiple adjacent grid locations at once. If the EDA software 12 allows only discrete positioning of vias, the granularity of the EDA software 12 locations may be used as the grid size if desired.

In an alternative embodiment, the signal via impedance adjustment tool may move the target signal vias to adjust characteristic impedance, although it may be difficult to reposition signal vias within the design constraints imposed by the EDA software 12 and the designer 14. Attempting to adjust impedance by repositioning signal vias may also lead to endless loops with the repositioning of one signal via causing impedance problems for another, requiring designer 14 intervention.

The signal via impedance verification and adjustment tools enable the designer 14 to rapidly and accurately control the characteristic impedance of signal vias in an electrical circuit design, thereby reducing or preventing signal distortion, particularly in high-speed circuits.

Signal Line Impedance Verification Tool

An exemplary embodiment of the signal line impedance verification tool searches through a circuit design database for line segments, using analytical formulas or a field solver to calculate the characteristic impedance of the line segments. The circuit design database may contain the same information as described above, but specifically for this exemplary embodiment, may include information about lines or traces, such as the net to which they belong, start and stop locations for each segment of the line, line thickness, etc. (Note again that the terms "line" and "trace" are used interchangeably herein to refer to horizontal or radial conductors in an electrical circuit.)

Figure 10:
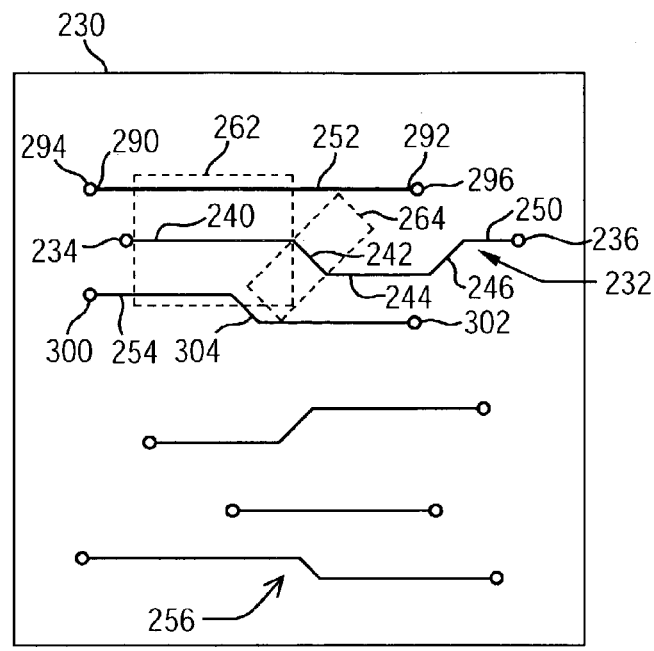
FIG. 10 is a top view of a portion of a layer in an exemplary circuit layout illustrating a target line segment for which impedance will be verified.

A line segment refers to a portion of a line. Generally, lines in an electrical circuit are formed of straight line segments that intersect with vias or other line segments at various angles. For example, FIG. 10 shows a top view of a portion 230 of a layer in an exemplary circuit layout. Only traces and vias are shown in this view to simplify the drawing and explanation, omitting other elements. Note that the configuration of vias and traces in FIG. 10 is purely exemplary and is not intended to represent an actual circuit layout or to limit the signal line impedance verification tool disclosed herein.

A portion 232 of a target net lies on the illustrated layer, running from a start via 234 to an end via 236. The portion 232 of the target net between the start via 234 and end via 236 is formed by a series of line segments 240, 242, 244, 246 and 250. In this exemplary circuit layout, several line segments 240, 244 and 250 are oriented in the same direction with one line segment 244 offset but parallel to the other. Remaining line segments 242 and 246 are connected and are oriented at some angle, such as 45 degrees, to the other line segments 240, 244 and 250 as appropriate.

Alternatively, line segments may have any other desired configuration, such as curved segments, etc., and may be selected in any desired manner to facilitate the impedance calculation for the net of which the line segment is a part.

The exemplary signal line impedance verification tool performs impedance calculations on line segments rather than on entire nets or on entire portions (e.g., 232) of nets lying on a single layer, thereby simplifying the calculation. This also aids the designer 14 in preventing impedance changes along a net, which might result in reflections and other errors. (Line segments under a minimum length specified by the designer 14 may be omitted from the impedance calculations for a net if desired.) However, the signal line impedance verification tool is not limited to any particular manner of dividing a net to simplify impedance calculations or to subdivide error indications. In fact, the signal line impedance verification tool may calculate characteristic impedance for an entire net at once if desired, although the calculation may become more complex.

As discussed above, the design database may be created by EDA software for logical circuit design followed by EDA software for physical circuit layout such as the APD package designer.

In this exemplary embodiment, the signal line impedance verification tool runs on top of the EDA software 12 as a script. For example, if the EDA software 12 comprises the APD package designer, the signal line impedance verification tool may be implemented as a script using the "Skill" scripting language and executed within the APD design environment. In this example, the circuit model access commands issued by the signal line impedance verification tool may comprise Skill commands issued to the APD package designer. Alternatively, the signal line impedance verification tool may be implemented as a standalone software application or as a script in another language such as Perl, as desired or as needed to operate with other EDA software.

The signal line impedance verification tool calculates the characteristic impedance of one or more line segments in the design database and compares the calculated characteristic impedance against the desired characteristic impedance. If a calculated characteristic impedance differs from the desired characteristic impedance or is not within a specified tolerance, the fault is flagged for later correction.

Referring again to FIG. 10, a portion 230 of a layer in an exemplary circuit layout may contain a portion 232 of a target net, along with neighboring lines 252 and 254, and more distant traces 256. Each line may end at a start and end via (e.g., 234, 236) or at other elements such as another line, or at electrical component connection pads (not shown). The target net includes five segments 240, 242, 244, 246 and 250, and the characteristic impedance of each segment 240–250 is calculated separately in the exemplary embodiment.

The signal line impedance verification tool may begin the impedance calculation for line segments (e.g., 240) by obtaining user input 260 (FIG. 15), part of which may include a definition of the window. The window used by the signal line impedance verification tool will be described in detail before continuing to describe other inputs.

In the signal via impedance verification tool described above, the window (130, FIG. 4) was a two-dimensional shape on a layer of the circuit, and the impedance calculations were based on the effect of neighboring vias in the window on a target via. The window was relatively simple, because the vias all run parallel to each other through the layer, and all for the same distance. Thus, a two-dimensional window has the same footprint of vias down through the layer at any level in the layer, that is, the cross-sectional view of the vias in the layer is the same at any level in the layer.

In contrast, the characteristic impedance of a line segment is mainly affected by neighboring lines that are located within a certain small distance of the line segment for a relatively substantial distance along the line segment. (The characteristic impedance is also affected by neighboring lines that only run near the line segment for very small distances, and more distant lines, etc., but these effects are relatively small and thus are neglected in the exemplary embodiment. These elements having a small effect on characteristic impedance may be included if desired in an alternative embodiment.) The window used to identify neighboring lines for a line segment is therefore more complex than the simple two-dimensional window of the signal via impedance verification tool described above, because the neighboring elements affecting the characteristic impedance of the line segment are not necessarily at a constant distance along the line segment.

A virtual three-dimensional (3-D) window is used in the exemplary embodiment. The 3-D window is virtual in the exemplary embodiment because the APD package designer does not provide a 3-D design environment—line segments in the design database are designated by their start and end location on a layer, and multiple layers are handled independently. The exemplary signal line impedance verification tool therefore issues design database access commands 50 requesting the start and end locations of lines on the target layer and neighboring layers as specified by the designer 14, and the impedance verification tool effectively interprets the data for the lines, locating them in the 3-D virtual window.

A top view of several exemplary 3-D virtual windows 262 and 264 is shown in FIG. 10. The first exemplary 3-D virtual window 262 corresponds to line segment 240, the second exemplary 3-D virtual window 264 corresponds to line segment 242. Note that the windows 262 and 264 are aligned with their corresponding line segments 240 and 242. The windows 262 and 264 may be specified by the designer 14 as the lateral or radial distance perpendicular from the target line segment to include on either side of the target line segment, and the number of layers above and below the target layer to consider. For example, if the designer 14 specified a distance of 800 microns, the virtual 3-D window would extend to 800 microns on either side of the target line segment on a layer, with the target line segment centered in the 1600 micron wide window.

Figure 11:
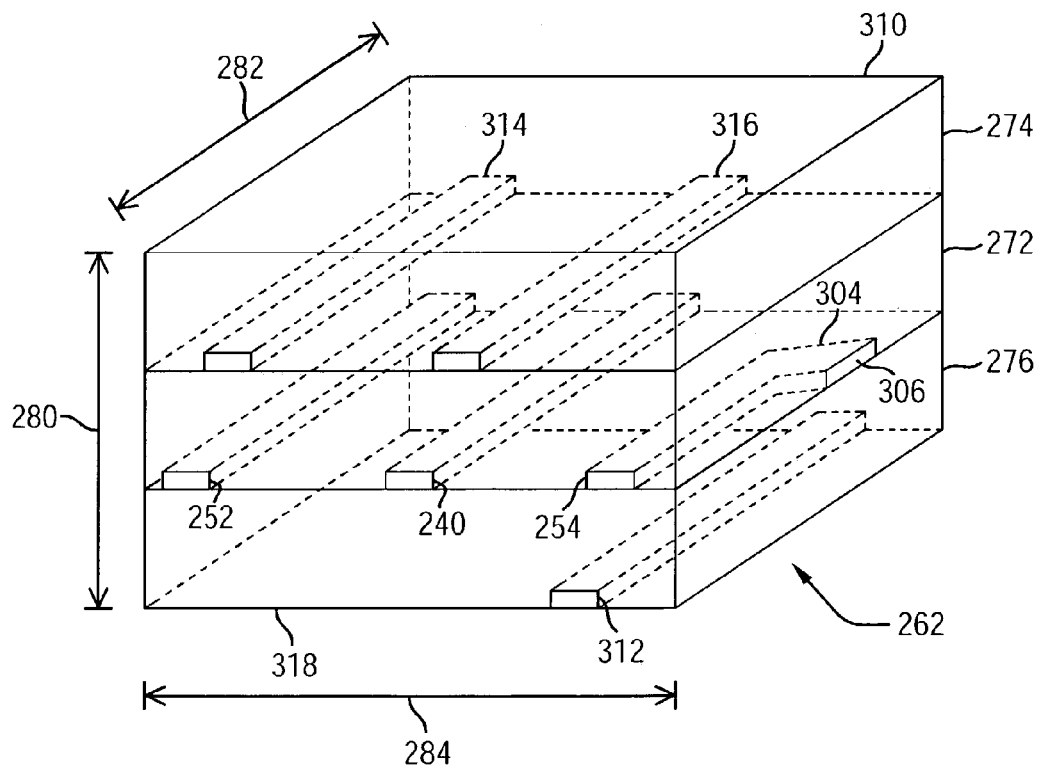
FIG. 11 is a perspective view of an exemplary three-dimensional window in which lines will be considered in calculating impedance for a target line segment.

A perspective view of the first virtual 3-D window 262 of FIG. 10 is shown in FIG. 11. The exemplary window 262 includes three layers, the target layer 272, a layer above 274 and a layer below 276. Note that the window 262 is not square (or cubical) in this exemplary embodiment. The height 280 of the window 262 depends on the number of layers considered and the physical height of each layer (both parameters may be input or hard-coded). The length 282 corresponds to the length of the target line segment 240, and the width 284 may be input by the designer 14 (or may be hard-coded in the impedance verification tool).

The target line segment 240 is centered in the target layer 272, and is surrounded on the target layer 272 by two neighboring lines 252 and 254 in the window 262. Given the start and end positions 290 and 292 of the first neighboring line 252 (at vias 294 and 296), it may be determined that the first neighboring line 252 parallels the target line segment 240 along the entire length of the window 262. However, the second neighboring line (ending at vias 300 and 302) has multiple segments, two of which 254 and 304 lie at least partially within the window 262. The first line segment 254 parallels the target line segment 240. The second line segment 304 is oriented at an angle to the target line segment 240, exiting a side 306 of the window 262 before reaching the end 310. Thus, at a portion of the window 262 near the end 310, the second neighboring line (ending at via 302) is not in the window 262.

The layer below 276 the target layer 272 contains a line 312 running parallel to the target line segment 240. The layer above 274 the target layer 272 contains two lines 314 and 316 also running parallel to the target line segment 240. As with the vias described above with respect to the signal via impedance verification tool, the lines may either carry signals or ground (or other reference voltage). In the exemplary circuit described herein, the two lines 314 and 316 in the upper layer 274 are ground lines, part of a ground grid in the upper layer 274.

Figure 12:
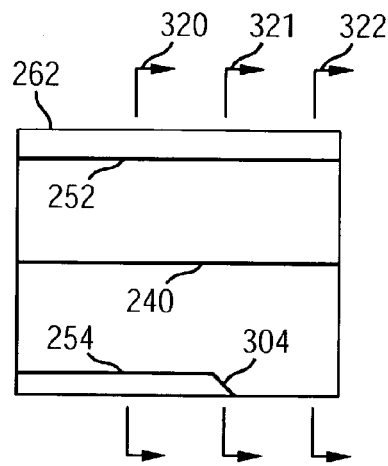
FIG. 12 is a top view of the three-dimensional window of FIG. 11 illustrating cross-section lines along which two-dimensional cross-sections of the three-dimensional window may be taken.

To calculate characteristic impedance for the target line segment 240 in the virtual 3-D window 262, a series of two-dimensional (2-D) calculations may be made, or a single 3-D calculation may be made. The exemplary embodiment of the signal line impedance verification tool employs a series of 2-D calculations, calculating the characteristic impedance of the target line segment 240 based on neighboring lines in a slice or cross-section of the virtual 3-D window 262. This is illustrated in FIG. 12 and FIGS. 13A–C. FIG. 12 is a top view of the virtual 3-D window 262 taken on the target layer 272, including the target line segment 240 and the neighboring line segments 252, 254 and 304. Impedance calculations may be made on a number of 2-D cross-sections of the window 262, such as along cross-section lines 320, 321 and 322.

The first 2-D face 324 taken at cross-section line 320 is illustrated in FIG. 13A. Note that the 2-D face 324 at cross-section line 320 is identical to the front face 318 of the virtual 3-D window 262 shown in FIG. 11, because the lines 240, 252, 254, 312, 314 and 316 all run parallel together from the front face 318 of the window 262 to the first cross-section line 320.

The second 2-D face 326 viewed at cross-section line 321 is illustrated in FIG. 13B. The only change on this 2-D face 326 is that line segment 254 does not appear in this cross-section, having been replaced by connected line segment 304. The line segment 304 angles away from the target line segment 240, and so appears farther to the right in this 2-D face 326 than line segment 254 appeared in the previous 2-D face 324.

Figure 13C:
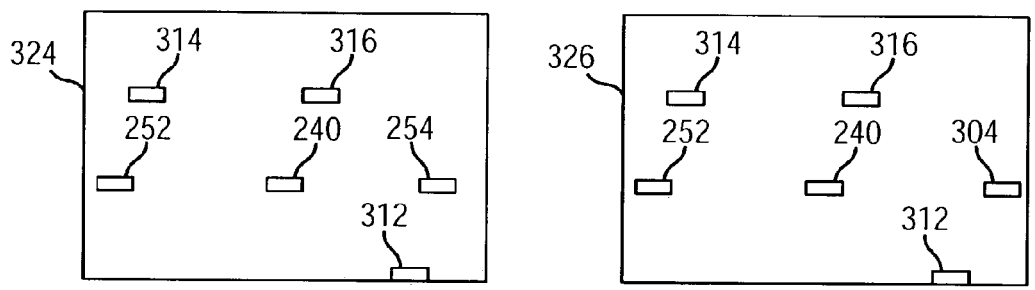
Figure 13C:
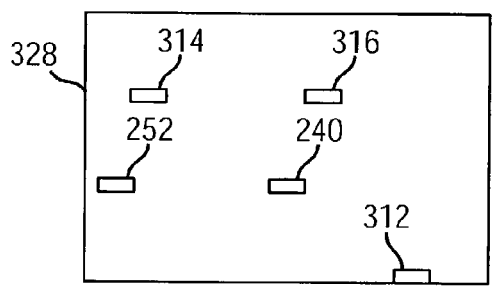

The third 2-D face 328 viewed at cross-section line 322 is illustrated in FIG. 13C. The only change on this 2-D face 328 is that line segments 254 and 304 are not in the window 262 in this cross-section.

The target line segment 240 may be flagged with an impedance error if any 2-D impedance calculation along the length of the target line segment 240 results in an incorrect characteristic impedance. Alternatively, the total characteristic impedance for the target line segment 240 in the window 262 may be calculated based on the 2-D impedance calculations made along the target line segment 240 at various cross-sections.

In the exemplary embodiment of the signal line impedance verification tool, however, the 2-D impedance calculations are not combined, and if any of the 2-D impedance calculations taken at cross-sections along the target line segment 240 result in an incorrect characteristic impedance, the entire target line segment 240 is flagged as having an incorrect characteristic impedance.

Figure 14:
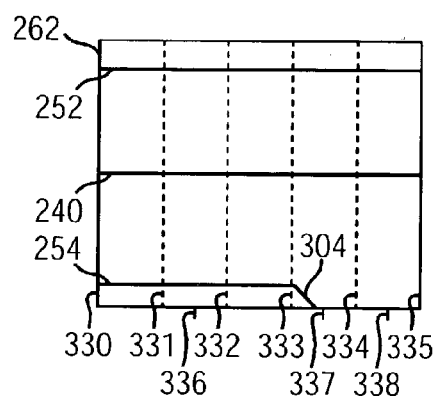
FIG. 14 is a top view of the three-dimensional window of FIG. 11 illustrating an exemplary process of selecting cross-section locations at which to calculate characteristic impedance.

This exemplary process is illustrated in FIG. 14, which is a top view of the virtual 3-D window 262 taken on the target layer 272, including the target line segment 240 and the neighboring line segments 252, 254 and 304. A granularity is determined for the cross-sections as discussed above with respect to FIGS. 12 and 13A–13C. In this example, assume that the target line segment 240 is 1 millimeter (mm) long, so the window 262 is 1 mm long, and that a granularity of 0.2 mm was specified by the designer 14 or was hard-coded in the tool. The window 262 is therefore divided into five sections by the start 330 of the window 262, by four section lines 331, 332, 333 and 334 placed at 0.2 mm intervals, and by the end 335 of the window 262.

The exemplary signal line impedance verification tool examines slices through the window 262, determining whether the traces (e.g., 240, 252, 254 and 304) change position in the slice. This enables the tool to avoid calculating the characteristic impedance of the target line segment 240 multiple times for slices that are identical. For example, the traces 240, 252 and 254 do not change position in the window 262 in the first three slices between 0 mm 330 and 0.2 mm 331, 0.2 mm 331 and 0.4 mm 332, and 0.4 mm 332 and 0.6 mm 333. The traces 240, 252 and 254 all run parallel through this section of the window 262, so it would waste time to perform an impedance calculation for each of these three sections. Instead, the exemplary signal line impedance verification tool performs a single impedance calculation at one cross-section location in the homogeneous region made up of the three sections from 0 mm 330 to 0.6 mm 333. Although this cross-section may be taken at any location in this homogeneous region, the exemplary signal line impedance verification tool performs the impedance calculation at the midpoint of the region, in this case at 0.3 mm 336. If the calculated characteristic impedance were incorrect, the target line segment 240 is flagged as incorrect and the impedance calculation process for the target line segment 240 may be stopped to save time.

If, however, the calculated characteristic impedance were correct in the homogeneous region from 0 mm 330 to 0.6 mm 333, the signal line impedance verification tool considers the next region, from 0.6 mm 333 to 0.8 mm 334. There is a change in this region, with the neighboring trace 254 ending and moving off at an angle as segment 304, then exiting the window 262. Therefore, this segment 0.6 mm 333 to 0.8 mm 334 is considered by itself, with the characteristic impedance calculated for the target line segment 240 at the midpoint of this region, or 0.7 mm 337. Finally, if the characteristic impedance calculated at 0.7 mm 337 is correct, the signal line impedance verification tool considers the next region, from 0.8 mm 334 to 1 mm 335. Again, there is a change in this region, although this region may also be considered automatically because it was not included in previous calculations, and it is the last region in the window 262. Therefore, the characteristic impedance of the target line segment 240 is calculated at the cross-section taken at 0.9 mm 338, the midpoint of the region from 0.8 mm 334 to 1 mm 335.

Again, the signal line impedance verification tool may combine multiple impedance calculation results, or may simply flag the target line segment 240 as having an incorrect characteristic impedance if any of the multiple calculations are incorrect.

Figure 15:
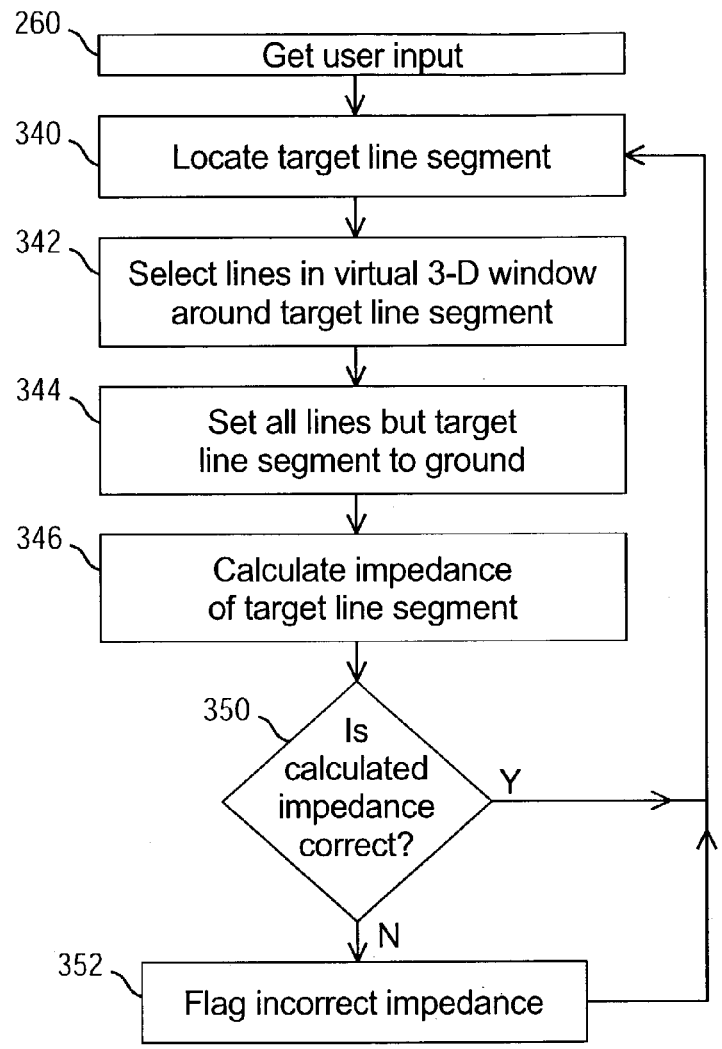
FIG. 15 is a flowchart summarizing an exemplary operation for verifying signal line impedance.

Referring to FIG. 15, the inputs which may be entered 260 by the designer 14 in the exemplary embodiment of the signal line impedance verification tool include the following:

Target nets

Layers on which characteristic impedance will be calculated for target nets

Window definition (such as the perpendicular distance from the target line segment and the number of layers to consider above and below the target layer)

Desired characteristic impedance or tolerance

Material properties

Minimum length of line segments for which characteristic impedance will be calculated Distance between 2-D slices in virtual 3-D window for 2-D impedance calculations Any or all of these exemplary inputs may alternatively be hard-coded in the signal line impedance verification tool. The window definition inputs are described above. The target nets may comprise a list of nets for which characteristic impedance should be verified. The layers on which to calculate characteristic impedance may also be specified. This allows the designer 14 to exclude layers from impedance calculations (not from use as neighboring layers in windows, but on which target line segments will not be selected). For example, there may be layers which cannot be modified due to manufacturing constraints or extremely tight design constraints. There would be no reason to calculate characteristic impedances for lines on that layer, because the characteristic impedances could not be adjusted.

The desired characteristic impedance and tolerance may also be entered as described above. Any line segment having a calculated characteristic impedance outside the specified tolerance from the desired characteristic impedance would be flagged with a DRC in the design database or elsewhere to indicate the error.

The designer 14 may also specify the material properties, such as the dielectric constant or electric permittivity epsilon and the magnetic permeability mu, if needed for the impedance calculation and if not hard-coded into the signal via impedance verification tool. The material properties are the characteristics of the material on which the lines are placed and by which layers are separated, such as the substrate of the IC or PCB.

If the designer 14 wishes to avoid calculating the characteristic impedance of very short line segments, a minimum line segment length for impedance calculations may be entered. For example, if two relatively long line segments are connected by an extremely short line segment, the characteristic impedance of the extremely short line segment will probably not vary much from the characteristic impedances at the ends of the surrounding longer line segments, because the environment of the extremely short line segment is substantially the same as that at the ends of the surrounding longer line segments. The designer 14 may prevent the signal line impedance verification tool from calculating the characteristic impedance of the extremely short line segment, thereby reducing processing time.

If the signal line impedance verification tool uses a series of 2-D impedance calculations to calculate the characteristic impedance of a line segment in a 3-D window, the granularity of the 2-D cross-sectional slices may be adjusted by entering the distance between slices, or the thickness of each slice.

Referring again to FIG. 15, once the inputs are obtained 260 by the signal line impedance verification tool, a target line segment is located 340 on a target net. Neighboring lines in a virtual 3-D window (e.g., 262) are selected 342. In the exemplary embodiment, the selection of neighboring lines is accomplished by submitting design database access commands 50 to the APD package designer and examining the layer and start and end points for line segments to determine whether they fall within the current window (e.g., 262).

All neighboring lines in the window (e.g., 262) are set to ground 344 (although some lines may already be ground lines by definition in the design database). The characteristic impedance of the target line segment is calculated 346 based on neighboring lines in the window (e.g., 262) and other relevant parameters such as the material properties. The calculated characteristic impedance of the target line segment is compared 350 with the desired characteristic impedance value. If the calculated characteristic impedance is not equal to the desired characteristic impedance value or if it does not fall within the specified tolerance, the line segment is flagged 352 with an error indicating the incorrect characteristic impedance value. The impedance calculations can then proceed for other target line segments 340 until all desired nets have been verified.

The line segments having incorrect characteristic impedance values may be flagged as described above, such as with a DRC. Each line segment on a net may have an entry in the design database, giving the start and end point, layer, line thickness, etc. If the characteristic impedance of the line segment is incorrect, the DRC may be associated with this entry in the design database for the target line segment. The DRC may be placed in the design database directly by the signal line impedance verification tool or through the APD package designer (or other EDA software) by issuing design database access commands 50.

Figure 16:
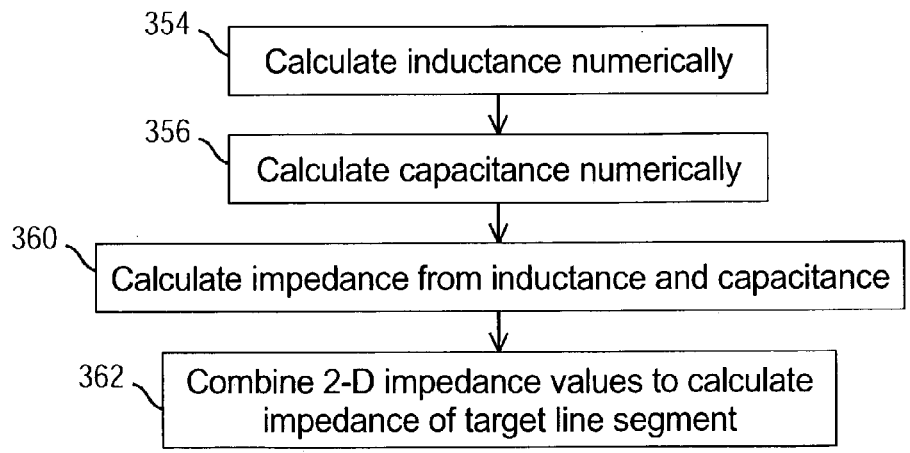
FIG. 16 is a flowchart summarizing an exemplary impedance calculation in an embodiment of the signal line impedance verification tool.

An exemplary operation for calculating characteristic impedance of a line segment is illustrated in FIG. 16. For each 2-D cross-sectional slice of the virtual 3-D window, the inductance L of the target line segment is calculated 354 numerically using any suitable technique, such as a finite element routine. The capacitance C of the target line segment is then calculated 356 numerically from the inductance using a formula such as $C=(\mu_0\epsilon_0\mu_r\epsilon_r)/L$. Alternatively, the capacitance C may be calculated first, followed by the inductance. The characteristic impedance $Z_0$ is then calculated 360 as the square root of the inductance L over the capacitance C. Finally, the calculated characteristic impedances of the target line segment at each 2-D cross-section are combined 362 to form a total calculated characteristic impedance for the target line segment. This combination may be performed in any suitable manner, such as interpolating between the calculated characteristic impedance points to find a best fitting line representing a changing characteristic impedance along the target line segment, then finding an average value for the characteristic impedance of the target line segment. (Alternatively, the 2-D cross-section values for inductance and capacitance may be combined before calculating a total $Z_0$ for the target line segment.)

Signal Line Impedance Adjustment Tool

Once signal line impedance errors are flagged in a suitable manner, such as with a DRC in the design database, a signal line impedance adjustment tool may be invoked to resolve impedance DRCs by correcting or minimizing the impedance error of a signal line. As with the signal via impedance adjustment tool described above, the signal line impedance adjustment tool may be implemented in any suitable manner, such as in a Skill script for use within the APD package designer. The signal line impedance adjustment tool adjusts the position of a signal line between neighboring elements to adjust the characteristic impedance of the signal line. The position of the signal line is adjusted according to the design constraints to better match the desired characteristic impedance for the transmission line formed by the signal line and the return path. The characteristic impedance of the signal line changes as the signal line moves in relation to its neighboring signal and ground lines, both on the same layer and in layers above and below, as explained with respect to the virtual 3-D window 262 of the signal line impedance verification tool.

The characteristic impedance may be calculated in any suitable available manner, such as with closed form formulae used in the signal line impedance verification tool. If an exact match to the desired characteristic impedance does not exist within the design constraints, the signal line impedance adjustment tool will attempt to minimize the impedance error by locating the best possible position for the signal line.

Figure 17:
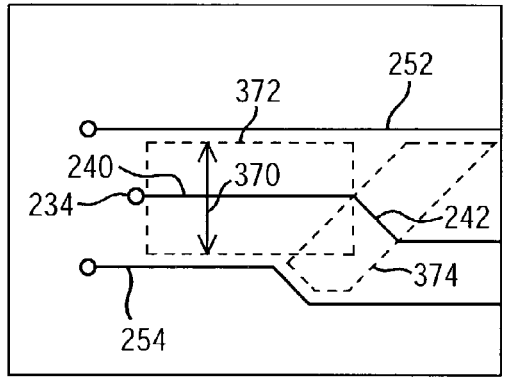
FIG. 17 is a top view of a portion of a layer in an exemplary circuit layout illustrating available ranges of movement for signal line segments for use in adjusting impedance.
Figure 18:
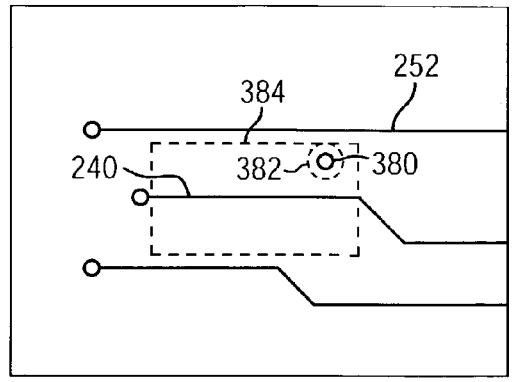
FIG. 18 is a top view of a portion of a layer in another exemplary circuit layout illustrating available ranges of movement for signal line segments for use in adjusting impedance.

Examples of these design constraints are illustrated in FIGS. 17 and 18, which show a top view of a portion of a layer in the exemplary circuit layout of FIG. 10. Referring now to FIG. 17, a target line segment 240 extends between a via 234 and another line segment 242. If the characteristic impedance of the target line segment 240 had been calculated by the signal line impedance verification tool and marked with an impedance DRC, the signal line impedance adjustment tool can adjust the position and layout of the target line segment 240 to correct or reduce the impedance error. However, design constraints (including manufacturing limitations) for the circuit limit the range 370 in which the target line segment 240 may be moved. For example, one design constraint may specify a minimum separation between line segments. The target line segment 240 may be moved up toward neighboring line segment 252, but no closer than specified by the design constraints. The target line segment 240 may also be moved down toward neighboring line segment 254, but again no closer than specified by the design constraints. The design constraints and the existing circuit layout define a region 372 (also referred to herein as an available adjustment region) in which the target line segment 240 may be moved to adjust its characteristic impedance. Similar regions (e.g., 374) are defined for other line segments (e.g., 242) by their neighboring line segments and by the design constraints.

Circuit elements other than lines may also impact the regions in which line segment positions may be adjusted, as shown in FIG. 18. In this exemplary circuit layout, a via 380 is located between the target line segment 240 and its neighboring line segment 252. Design constraints may specify a minimum separation between lines and vias, so the target line segment 240 cannot be moved inside a region 382 around the via 380. This further limits the relocation of the target line segment 240 within the available adjustment region 384.

The shape of the available adjustment region (e.g., 372, 374 and 384) is dependent upon the circuit layout and the design constraints, and may further be limited by user inputs from the designer 14. The signal line impedance adjustment tool may identify available adjustment regions for a target signal line segment as described above. Alternatively, the signal line impedance adjustment tool may simply begin moving the target signal line segment, determining after each shift whether the new trial position violates any design constraints, and moving in each direction until a design constraint is violated or until every position within a window (e.g., 262) has been tried.

Figure 19A:
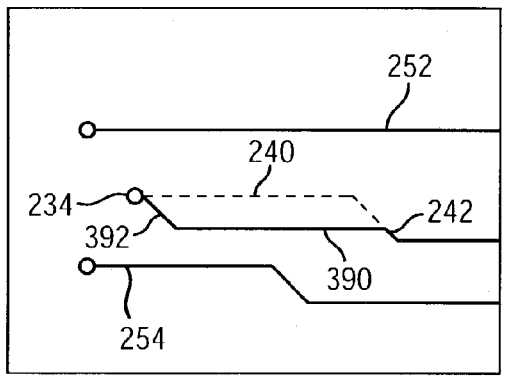
FIGS. 19A–19D are top views of a portion of a layer in another exemplary circuit layout illustrating adjusted positions and thickness of a signal line segment to adjust impedance.

The circuit elements to which the ends of the target signal line segment are connected may also limit the available adjustment region for a target signal line segment. Additional line segments may be used to connect the adjusted target signal line segment to these circuit elements. For example, see FIG. 19A, wherein the target signal line segment 240 is shifted from its original position (indicated by a dashed line) down into a new position 390 nearer a neighboring line segment 254. The target signal line segment 240 is connected to a via 234 at one end and another line segment 242 at the other end. A new connecting line segment 392 is added between the via 234 and the end of the target signal line segment in its new position 390. At the other end of the target signal line segment, the line segment 242 is shortened to meet the target signal line segment in the new position 390.

Figure 19B:
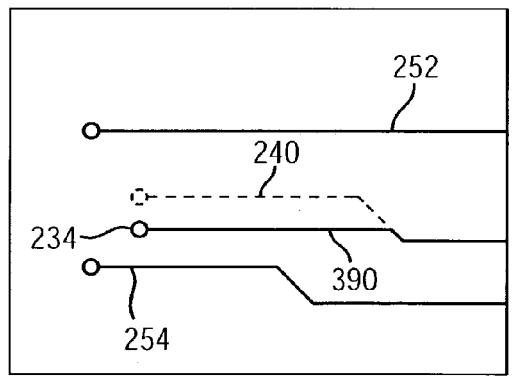

In another example (see FIG. 19B) in which the via 234 is movable, the position of the via 234 is shifted to meet the end of the shifted target signal line segment in its new position 390. A new connecting line segment between the via 234 and the target signal line segment 240 is therefore not needed.

Figure 19C:
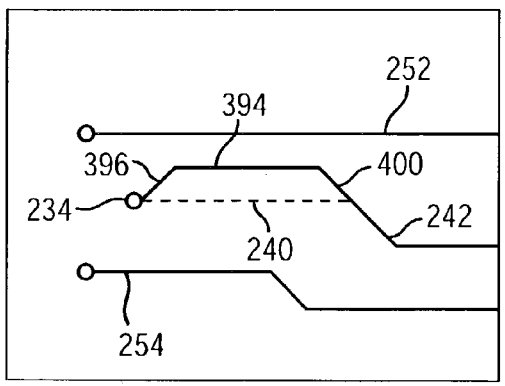

In another example (see FIG. 19C), the target signal line segment is shifted up into a new position 394 nearer a neighboring line segment 252. As noted above, the target signal line segment is connected to a via 234 at one end and another line segment 242 at the other end. A new connecting line segment 396 is added between the via 234 and the end of the target signal line segment in its new position 394. At the other end of the target signal line segment, the line segment 242 is extended 400 to meet the target signal line segment in the new position 394.

Figure 19D:
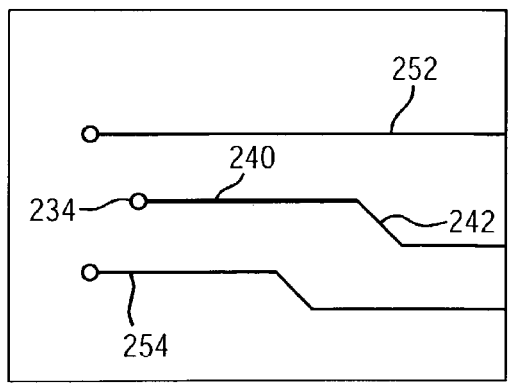

Alternative techniques may be used to adjust the characteristic impedance of signal lines, as allowable by the manufacturing requirements and design constraints. For example, as shown in FIG. 19D, the width of line segments may be altered to adjust the characteristic impedance of signal lines. In this example, the target signal line segment 240 has been widened between the via 234 at one end and the connecting line segment 242 at the other end. In another alternative, if ground lines (e.g., 314 and 316) in the window (e.g., 262) around the target signal line segment are adjustable, the ground line positions may be adjusted rather than the target signal line segment.

If new line segments (e.g., 392, 396) are added during the adjustment process, they may be added directly by the signal line impedance adjustment tool or through the EDA software using design database access commands 50. The new line segments (e.g., 392, 396) are configured according to the design constraints used to lay out the circuit. For example, one constraint may discourage or forbid wide angles between line segments, so the new line segments (e.g., 392, 396) would be placed so that they connect at smaller angles (such as 45 degrees) to the shifted target signal line segment.

Figure 20:
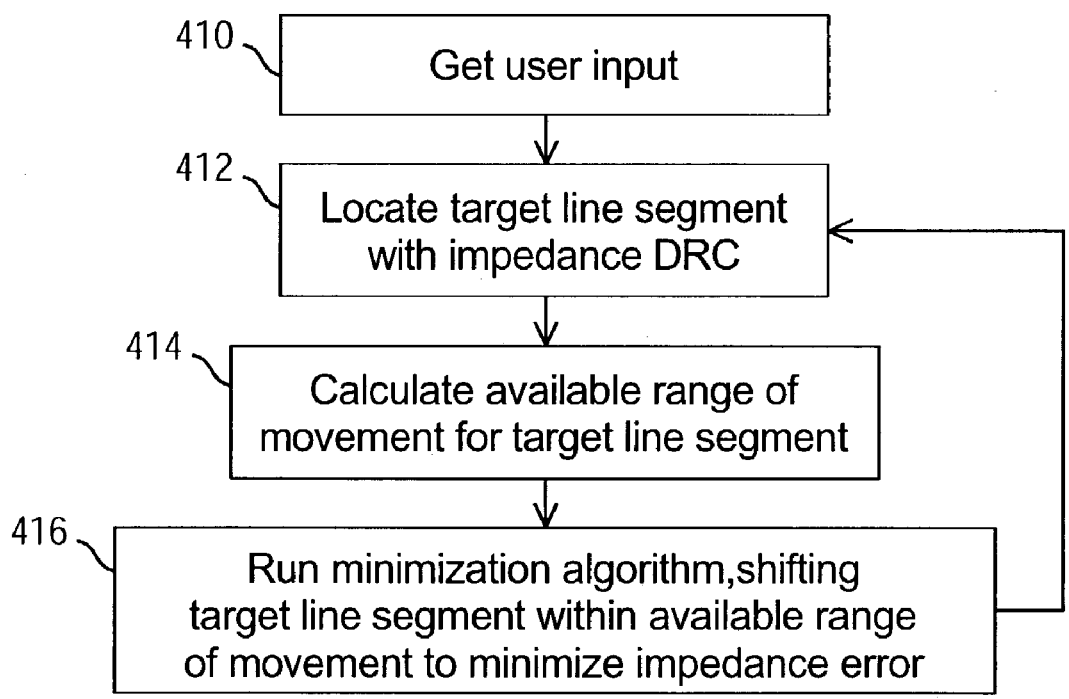
FIG. 20 is a flowchart summarizing an exemplary operation for adjusting signal line impedance.

The operation of the signal line impedance adjustment tool is illustrated in the flowchart of FIG. 20. User input is obtained 410 as in the signal line impedance verification tool described above, such as the window definition, material properties, desired target nets, and the desired impedance or tolerance. This information may be stored by the signal line impedance verification tool in the design database or elsewhere, or may be entered by the designer 14. A signal line segment with an impedance error is located 412, either manually or by automatically scanning through the design database, examining each of the nets listed in the input, to find signal line segments with impedance DRCs. For example, to manually initiate the impedance adjustment process, the EDA software 12 may display a graphical circuit representation 26, including icons indicating a DRC. The designer 14 would then be able to select the desired DRC icon for a signal line segment having an incorrect characteristic impedance to adjust its characteristic impedance.

The available range of movement (e.g., 372, 374, 384) for the target signal line segment may be calculated 414 as described above. Alternatively, acceptable placement for the target signal line segment may be determined dynamically as new positions are tried.

A one-dimensional minimization algorithm is executed 416 to locate the best position for the target signal line segment that corrects or minimizes the characteristic impedance error. The algorithm shifts the target signal line segment to a number of trial locations within the available range 370 or within a specified window (e.g., 262). The algorithm is one-dimensional because it shifts the target signal line segment from side to side only on its own layer, not up and down to other layers in the circuit. At each trial location, the characteristic impedance of the target signal line segment is recalculated. The characteristic impedance may be calculated in the same manner as described above with respect to the signal line impedance verification tool.

Pseudo-code is listed below for one exemplary two-dimensional minimization algorithms.

In a first example, an available adjustment region for the target signal line segment is calculated, so there is no danger of violating design constraints as long as the target signal line segment stays in the available adjustment region. Variables in the following pseudo-code are given in capital letters.

Set MINIMUM to a very large number and note the original position.
Move the target signal line segment by a preselected increment
While target signal line segment is still in the available adjustment region do {
Calculate $Z_0$ of target signal line segment
Set SCORE to the difference between the calculated $Z_0$ and the desired $Z_0$
if SCORE <MINIMUM, set MINIMUM equal to SCORE and note this position
Move the target signal line segment by a preselected increment
}End of while loop
Place the target signal line segment in the position corresponding to the MINIMUM.

In a second example, an available adjustment region for the target signal line segment is not calculated. The target signal line segment is moved from side to side within a window (e.g., 262), so some trial positions may violate design constraints. If a trial position violates design constraints, it is given a very large score to prevent the minimization algorithm from selecting that location, as shown in the following pseudo-code:

Set MINIMUM to a very large number and note the original position
   Move the target signal line segment by a preselected increment
   While target signal line segment is still in the window do
   {
    if design constraints violated in this position then set SCORE=a very large number
    else
     Calculate $Z_0$ of target signal line segment
     Set SCORE to the difference between the calculated $Z_0$ and the desired $Z_0$
    }
    if SCORE<MINIMUM, set MINIMUM equal to SCORE and note this position
    Move the target signal line segment by a preselected increment
   }End of while loop
Place the target signal line segment in the position corresponding to the MINIMUM.

In this exemplary minimization algorithm, the granularity between each trial position for the target signal line segment may be entered as an input by the designer 14 or may be hard-coded in the signal line impedance adjustment tool. For example, the minimization algorithm may be able to try many positions for the target signal line segment, with small differences between each position, giving good control over the impedance adjustment but taking longer to process. Alternatively, the minimization algorithm may be able to try fewer positions with larger spacing between the trial positions, giving less control over impedance adjustment but providing faster processing. If the EDA software 12 allows only discrete positioning of signal line segments, the distance between each trial location may be set to the granularity of the EDA software 12 locations if desired.

After the impedance adjustment process is complete for the target signal line segment (e.g. 240), the impedance DRC for the target signal line segment is cleared, and the next signal line segment having an impedance DRC may be adjusted.

When the signal line impedance adjustment tool adds new line segments to compensate for shifted target signal line segments, it effectively divides the shifted target signal line segment, and it may be desirable to verify the characteristic impedance of the newly added signal line segments. Whether to verify the characteristic impedance of newly added signal line segments may depend on the length of the newly added signal line segment—if it is at least as long as the specified minimum line segment length for impedance verification, its characteristic impedance may be automatically verified.

Moving the target signal line segment may also affect the impedance of neighboring signal line segments, and it may also be desirable to re-verify their characteristic impedances. This may be accomplished by clearing any impedance DRCs for neighboring signal line segments in the window (e.g., 262) and re-running the signal line impedance verification tool for those signal line segments. If the characteristic impedance of neighboring signal line segments is negatively impacted, the signal line impedance adjustment tool may prompt the designer 14 to intervene, rather than automatically correcting them, to prevent endless loops of adjusting neighboring signal line segments back and forth.

The signal line impedance adjustment tool enables the designer 14 to rapidly and accurately control the impedance of signal lines in an electrical circuit design, thereby reducing or preventing signal distortion, particularly in high-speed circuits.

Differential Line Pair Impedance Verification Tool

An exemplary embodiment of the differential line pair impedance verification tool searches through a circuit design database for differential line pair segments, using numerical formulas or an analytical field solver to calculate the odd mode characteristic impedance ($Z_{odd}$) of each segment of the differential line pairs. The circuit design database may contain the same information as described above, but specifically for this exemplary embodiment, may include information about differential line pairs carrying signals in the electrical circuit, such as the net to which they belong, start and stop locations for each segment of the differential line pair, line thickness, etc.

The differential line pair impedance verification tool operates much like the signal line impedance verification tool described above, except that it calculates the odd mode characteristic impedance of a differential line pair rather than the characteristic impedance of a single signal line.

Figure 21:
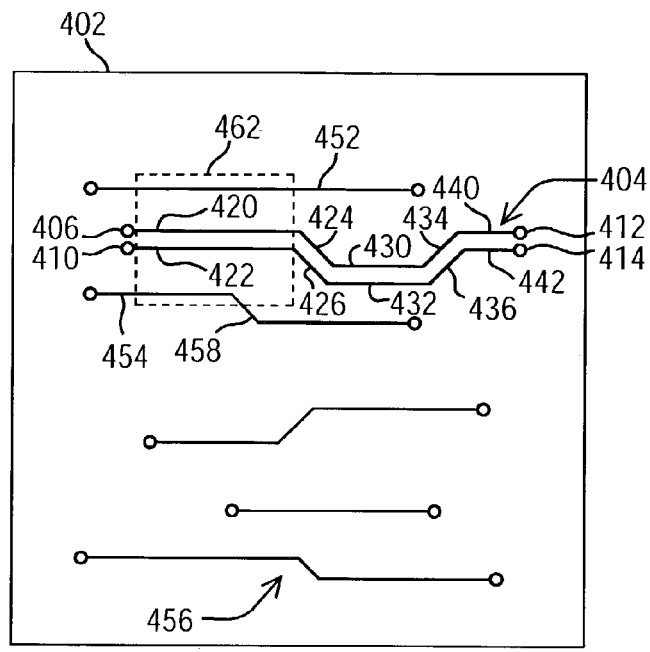
FIG. 21 is a top view of a portion of a layer in an exemplary circuit layout illustrating a target differential line pair segment for which odd mode characteristic impedance will be verified.

FIG. 21 shows a top view of a portion 402 of a layer in an exemplary circuit layout. Note that the configuration of vias and traces in FIG. 21 is purely exemplary and is not intended to represent an actual circuit layout or to limit the differential line pair impedance verification tool disclosed herein. For example, the portion 402 of the layer in the exemplary circuit layout includes both differential line pairs and single lines, which may be discouraged in some circuit designs.

A portion 404 of a target differential net lies on the illustrated layer, running from a pair of start vias 406 and 410 to a pair of end vias 412 and 414. The portion 404 of the target differential net between the start vias 406 and 410 and end vias 412 and 414 is formed by a series of paired line segments 420, 422, 424, 426, 430, 432, 434, 436, 440 and 442. In this exemplary circuit layout, several paired line segments 420 and 422, 430 and 432, and 440 and 442 are running in the same direction with one pair of line segments 430 and 432 offset but parallel. Remaining paired line segments 424, 426, 434 and 436 are oriented at an angle such as 45 degrees to the others.

The exemplary differential line pair impedance verification tool performs odd mode characteristic impedance calculations on paired line segments rather than on entire nets or on entire portions (e.g., 404) of nets lying on a single layer, thereby simplifying the calculation. This also aids the designer 14 in preventing odd mode characteristic impedance changes along a net, which might result in reflections and other errors. (Line pair segments less than a minimum length specified by the designer 14 or hardcoded in the tool may be omitted from the impedance calculations for a net if desired.)

As discussed above, the design database may be created by EDA software for logical circuit design followed by EDA software for physical circuit layout such as the APD package designer.

In this exemplary embodiment, the differential line pair impedance verification tool runs on top of the EDA software 12 as a script. For example, if the EDA software 12 comprises the APD package designer, the differential line pair impedance verification tool may be implemented as a script using the "Skill" scripting language and executed within the APD design environment. In this example, the circuit model access commands issued by the differential line pair impedance verification tool may comprise Skill commands issued to the APD package designer. Alternatively, the differential line pair impedance verification tool may be implemented as a standalone software application or as a script in another language such as Perl, as desired or as needed to operate with other EDA software.

The differential line pair impedance verification tool calculates the odd mode characteristic impedance of one or more differential line pair segments in the design database and compares the calculated odd mode characteristic impedance against the desired odd mode characteristic impedance. If a calculated odd mode characteristic impedance differs from the desired odd mode characteristic impedance or is not within a specified tolerance, the fault is flagged for later correction.

Referring again to FIG. 21, a portion 402 of a layer in an exemplary circuit layout may contain a portion 404 of a target differential net, along with neighboring lines 452 and 454, and more distant traces 456. Each line segment, whether single or differential, may end at a start and end via (e.g., 406, 412) or at other elements such as another line segment or electrical component connection pads (not shown). The target differential net includes five differential line pair segments 420–442, and the odd mode characteristic impedance of each differential line pair segment (e.g., 420 and 422) is calculated separately in the exemplary embodiment.

The differential line pair impedance verification tool may establish a window 462 (FIG. 22) in the same manner as in the signal line impedance verification tool described above. A virtual three-dimensional (3-D) window is used in the exemplary embodiment of the differential line pair impedance verification tool. A top view of the exemplary 3-D virtual window 462 is shown in FIG. 21. The window 462 may be specified by the designer 14 with the lateral or radial distance perpendicular from the target differential line pair segment to include on either side of the target differential line pair segment, and the number of layers above and below the target layer to consider. This distance may be measured either from the midpoint between the traces 420 and 422 forming the differential line pair segment, or from each trace 420 and 422. For example, if the designer 14 specified a distance of 800 microns, the virtual 3-D window may extend to 800 microns above the top trace 420 and 800 microns below the bottom trace 422 in the differential line pair segment (as seen in FIG. 21).

Figure 22:
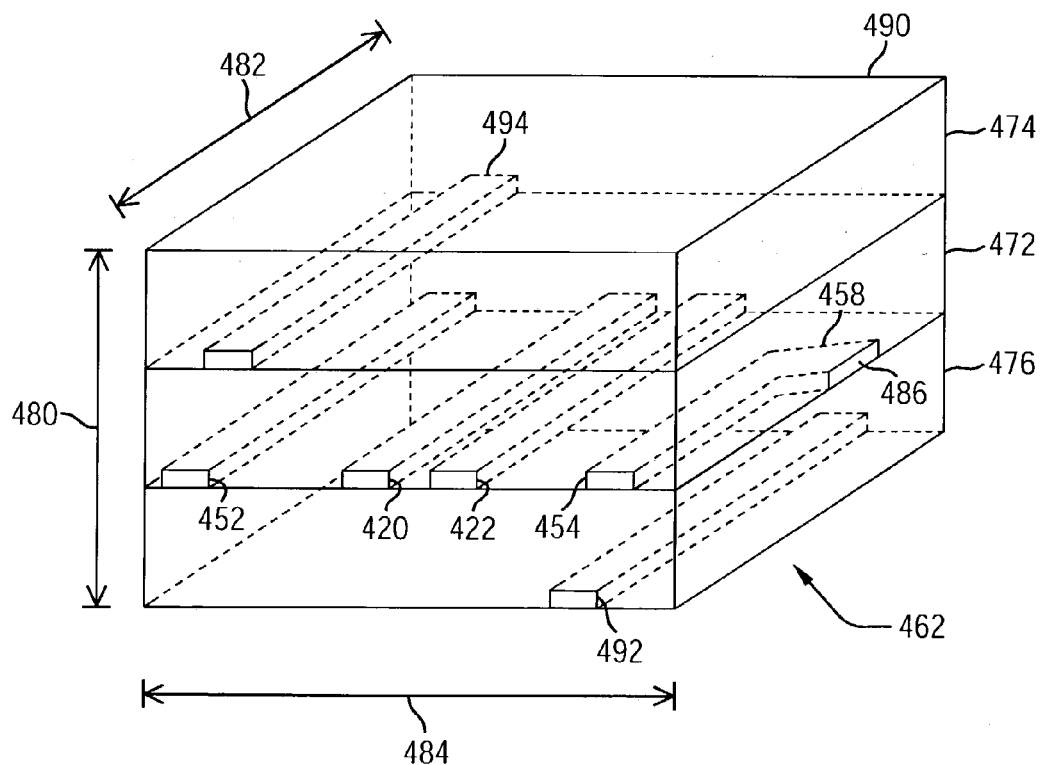
FIG. 22 is a perspective view of an exemplary three-dimensional window in which lines will be considered in calculating odd mode characteristic impedance for a target differential line pair segment.

FIG. 22 contains a perspective view of the virtual 3-D window 462 including the target layer 472, a portion 402 of which is shown in FIG. 21 in a top view. The exemplary window 462 includes three layers, the target layer 472, a layer above 474 and a layer below 476. Note that the window 462 is not square (or cubical) in this exemplary embodiment. The height 480 of the window 462 depends on the number of layers considered and the physical height of each layer (both parameters may be input or hard-coded). The length 482 corresponds to the length of the target differential line pair segment 420 and 422. If the traces 420 and 422 are not coextensive, the window 462 of the exemplary embodiment is as long as the coextensive portion of the differential line pair segment, letting longer ends of the traces (e.g., the end of trace 420) extend outside the window 462. Alternatively, the length 482 of the window 462 may extend to the furthest reaches of either trace 420 or 422 in the differential line pair segment. The width 484 may be input by the designer 14 (or may be hard-coded in the impedance verification tool).

The target differential line pair segment 420 and 422 is centered in the target layer 472, and is surrounded on the target layer 472 by two neighboring lines 452 and 454 in the window 462. The first neighboring line 452 parallels the target differential line pair segment 420 and 422 along the entire length of the window 462. However, the second neighboring line has multiple segments, two of which 454 and 458 lie within the window 462. The first line segment 454 parallels the target differential line pair segment 420 and 422. The second line segment 458 is oriented at an angle to the target differential line pair segment 420 and 422, exiting a side 486 of the window 462 before reaching the end 490. Thus, at a portion of the window 462 near the end 490, the second neighboring line (including line segments 454 and 458) is not in the window 462.

The layer below 476 the target layer 472 contains a line 492 running parallel to the target differential line pair segment 420 and 422. The layer above 474 the target layer 472 contains a line 494, also running parallel to the target differential line pair segment 420 and 422. As with the lines described above with respect to the signal line impedance verification tool, the lines (e.g., 492 and 494) may either carry signals or ground (or another reference voltage). In the exemplary circuit described herein, the line 494 in the upper layer 474 is a ground line, part of a ground grid in the upper layer 474.

To calculate the odd mode characteristic impedance for the target differential line pair segment 420 and 422 in the virtual 3-D window 462, a series of two-dimensional (2-D) calculations may be made, or a single 3-D calculation may be made. The exemplary embodiment of the differential line pair impedance verification tool employs a series of 2-D calculations, calculating the odd mode characteristic impedance of the target differential line pair segment 420 and 422 based on neighboring lines (whether single or differential) in a slice or cross-section of the virtual 3-D window 462. (Cross-sectional slicing of a virtual 3-D window (e.g., 262 and 462) is described above with respect to the signal line impedance verification tool.) The series of 2-D impedance calculations may be performed as described above with respect to the signal line impedance verification tool, either flagging the target differential line pair segment 420 and 422 if any of the calculations indicate an error, or combining the calculations to consider the combined total odd mode characteristic impedance for the target differential line pair segment 420 and 422.

Figure 23:
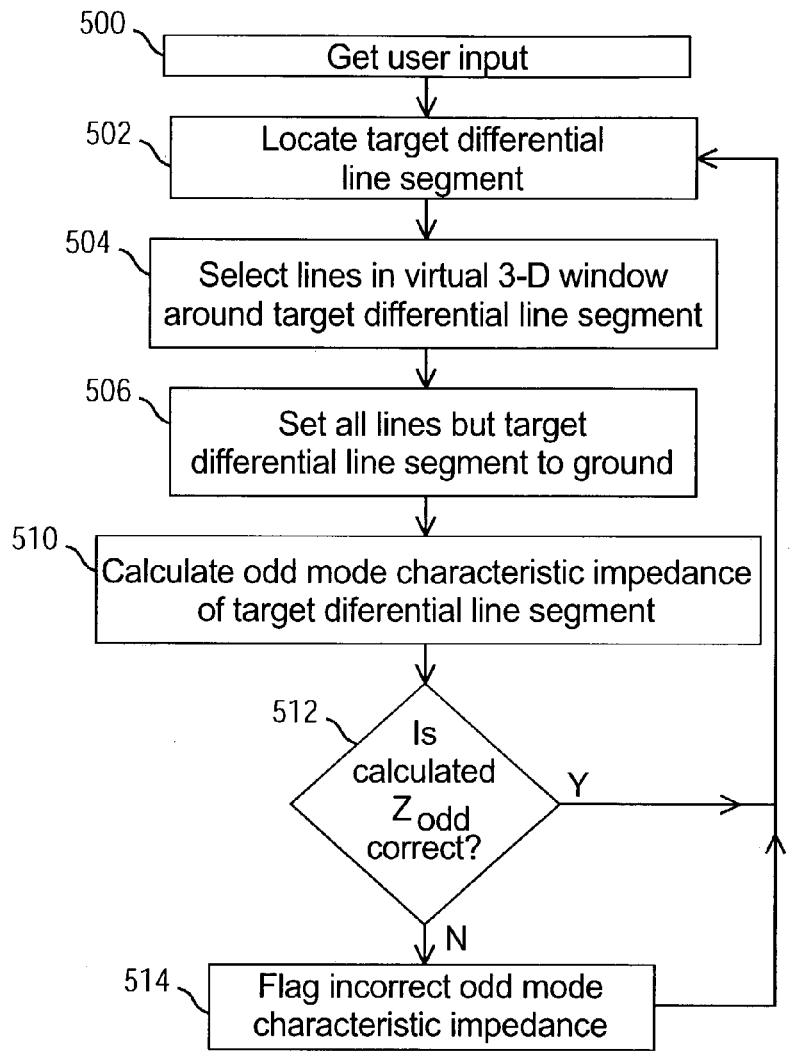
FIG. 23 is a flowchart summarizing an exemplary operation for verifying differential line pair odd mode characteristic impedance.

The operation of the differential line pair impedance verification tool is illustrated in the flowchart of FIG. 23. User input is obtained 500 as in the signal line impedance verification tool described above. The inputs which may be entered 500 by the designer 14 in the exemplary embodiment of the differential line pair impedance verification tool include the following:

Target differential nets

Layers on which odd mode characteristic impedance will be calculated for target differential nets Window definition (such as the perpendicular distance from the target differential line pair segment and the number of layers to consider above and below the target layer)

Desired odd mode characteristic impedance or tolerance

Material properties

Minimum length of line segments for which odd mode characteristic impedance will be calculated Distance between 2-D slices in virtual 3-D window for 2-D odd mode calculations Any or all of these exemplary inputs may alternatively be hard-coded in the differential line pair impedance verification tool. The window definition inputs are described above. The target differential nets may comprise a list of differential nets for which odd mode characteristic impedance should be verified. The layers on which to calculate odd mode characteristic impedance may also be specified. This allows the designer 14 to exclude layers from impedance calculations (not from use as neighboring layers in windows, but on which target differential line pair segments will not be selected). For example, there may be layers which cannot be modified due to manufacturing constraints or extremely tight design constraints. There would be no reason to calculate odd mode characteristic impedances for differential line pairs on that layer, because the odd mode impedances could not be adjusted.

The desired odd mode characteristic impedance and tolerance may also be entered as described above. Any differential line pair segment having a calculated odd mode characteristic impedance outside the specified tolerance from the desired odd mode characteristic impedance would be flagged with a DRC in the design database or elsewhere to indicate the error.

The designer 14 may also specify the material properties, such as the dielectric constant or electric permittivity epsilon and the magnetic permeability mu, if needed for the impedance calculation and if hot hard-coded into the differential line pair impedance verification tool. The material properties are the characteristics of the material on which the lines are placed and by which layers are separated, such as the substrate of the IC or PCB.

If the designer 14 wishes to avoid calculating the odd mode characteristic impedance of very short differential line pair segments, a minimum segment length for impedance calculations may be entered. For example, if two relatively long differential line pair segments are connected by an extremely short differential line pair segment, the odd mode characteristic impedance of the extremely short differential line pair segment will probably not vary much from the odd mode characteristic impedances at the ends of the surrounding longer differential line pair segments, because the environment of the extremely short differential line pair segment is likely substantially the same as that at the ends of the surrounding longer differential pair segments. The designer 14 may prevent the differential line pair impedance verification tool from calculating the odd mode characteristic impedance of the extremely short differential line pair segment, thereby reducing processing time.

If the differential line pair impedance verification tool uses a series of 2-D impedance calculations to calculate the odd mode characteristic impedance of a differential line pair segment in a 3-D window, the granularity of the 2-D cross-sectional slices may be adjusted by entering the distance between slices, or the thickness of each slice.

Referring again to FIG. 23, once the inputs are obtained 500 by the differential line pair impedance verification tool, a target differential line pair segment is located 502 on a target differential net. This is done by first selecting a differential net from those specified in the input, selecting a layer from those specified in the input and on which the selected differential net appears, then locating a differential line pair segment in the selected net on the selected layer. Each net in the input list is processed entirely (except on layers not listed in the input) by processing each differential line pair segment on each listed layer for each listed net.

Continuing with the odd mode characteristic impedance verification process, neighboring lines (e.g., 452, 454 (and 458), 492 and 494), whether single or differential, are selected 504 in the virtual 3-D window (e.g., 462). Note that neither trace 420 or 422 in the target differential line pair segment is selected. All neighboring lines in the window 462 are set to ground 506 (although some lines may already be ground lines by definition in the design database). The odd mode characteristic impedance of the target differential line pair segment is calculated 510 based on neighboring lines in the window 462 and other relevant parameters such as the material properties. The calculated odd mode characteristic impedance of the target differential line pair segment is compared 512 with the desired odd mode characteristic impedance value. If the calculated odd mode characteristic impedance is not equal to the desired odd mode characteristic impedance value or if it does not fall within the specified tolerance, the differential line pair segment is flagged 514 with an error indicating the incorrect odd mode characteristic impedance value. The impedance calculations can then proceed for other target differential line pair segments 502 until all desired differential nets have been verified.

Figure 24:
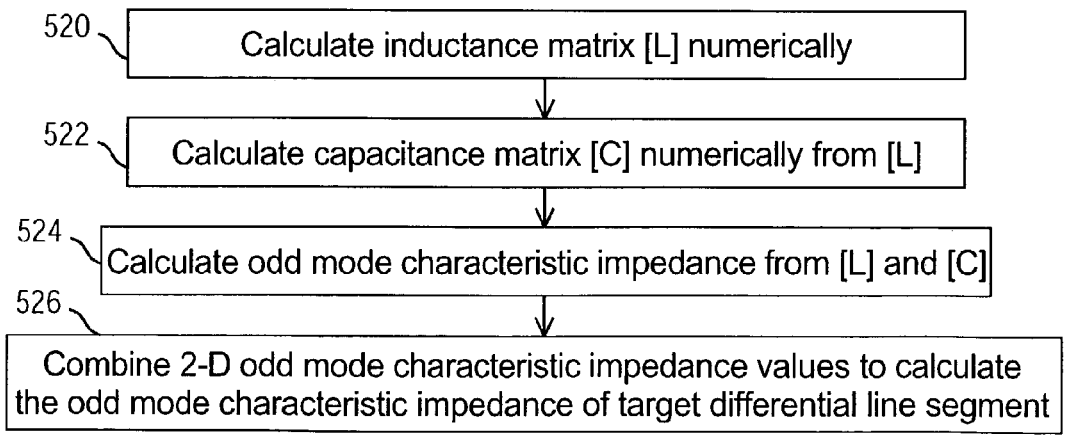
FIG. 24 is a flowchart summarizing an exemplary odd mode characteristic impedance calculation in an embodiment of the differential line pair impedance verification tool.

An exemplary operation for calculating the odd mode characteristic impedance of a differential line pair segment is illustrated in FIG. 24. For each 2-D cross-sectional slice of the virtual 3-D window, the inductance matrix [L] of the target differential line pair segment is calculated 520 numerically using any suitable technique, such as a finite element routine. The capacitance matrix [C] of the target differential line pair segment is then calculated 522 numerically from the inductance matrix using a formula such as $[C]= (\mu_0 \epsilon_0 \mu_r \epsilon_r)/[L]$, where the inductance and capacitance matrices may be represented as follows:

$$[L] = \begin{bmatrix} L_{11} & L_{12} \\ L_{21} & L_{22} \end{bmatrix} \quad [C] = \begin{bmatrix} C_{11} & C_{12} \\ C_{21} & C_{22} \end{bmatrix}$$

Alternatively, the capacitance matrix [C] may be calculated first, followed by the inductance matrix [L]. The odd mode characteristic impedance $Z_{odd}$ is then calculated 524 as follows:

$$Z_{odd} = 2\sqrt{\frac{L_{11} + L_{22} - 2L_{12}}{C_{11} + C_{22} + 2C_{12}}}$$

Finally, the calculated odd mode characteristic impedances of the target differential line pair segment at each 2-D cross-section are combined 526 to form a total calculated odd mode characteristic impedance for the target differential line pair segment. (Alternatively, the 2-D cross-section values for the inductance matrices and capacitance matrices may be combined before calculating a total $Z_{odd}$ for the target differential line pair segment.)

Differential Line Pair Impedance Adjustment Tool

Once differential line pair impedance errors are flagged in a suitable manner, such as with a DRC in the design database, a differential line pair impedance adjustment tool may be invoked to resolve impedance DRCs by correcting or minimizing the impedance error of a differential line pair. The differential line pair impedance adjustment tool adjusts the odd mode and individual characteristic impedances using a recursive algorithm to vary the cross-sectional properties of the differential line pair, such as the spacing between the traces in the differential line pair, the distance between the differential line pair and neighboring lines, and the width of the traces in the differential line pair. As with the signal line impedance adjustment tool described above, the differential line pair impedance adjustment tool may be implemented in any suitable manner, such as in a Skill script for use within the APD package designer.

The differential line pair impedance adjustment tool varies the position of the traces in a differential line pair to adjust the odd mode characteristic impedance $Z_{odd}$ of the differential line pair and the characteristic impedance of the individual traces in the differential pair, thereby controlling $Z_{odd}$ and balancing the lines. Balancing the lines, that is, matching the characteristic impedance of each line in the differential pair, reduces common mode convergence.

The characteristic impedance values may be calculated in any suitable manner, such as numerically with closed form formulae or analytically with a field solver. If an exact match to the desired odd mode characteristic impedance of the differential line pair or the desired characteristic impedance of the individual traces in the differential line pair does not exist within the design constraints, the differential line pair impedance adjustment tool will attempt to minimize the impedance error by locating the best possible cross-sectional properties for the differential line pair. The designer 14 using the differential line pair impedance adjustment tool may specify the priority of the odd mode characteristic impedance versus the characteristic impedance of the individual traces. For example, the designer 14 may specify that optimizing the odd mode characteristic impedance of the differential line pair is most important, or that setting the values of the characteristic impedances of the individual traces in the differential line pair is most important, or that equalizing the characteristic impedances of the individual traces in the differential line pair regardless of actual characteristic impedance level is most important. The designer 14 may control this in any suitable manner, such as specifying a ratio of importance between the various controllable impedance values.

The line segments forming the differential line pair may be moved in two dimensions (side to side) as described above with respect to the signal line impedance adjustment tool. When line segments are moved, connecting elements may need to be modified as well, such as shifting connecting vias, adding new connecting line segments, or moving, lengthening or shortening existing connecting line segments, as illustrated in FIGS. 19A–19D. The modifications to connecting elements will not be described again at this point, but it is to be understood that adjustment of a differential line pair may use the same type of end point adjustment as described above.

Figure 25A:
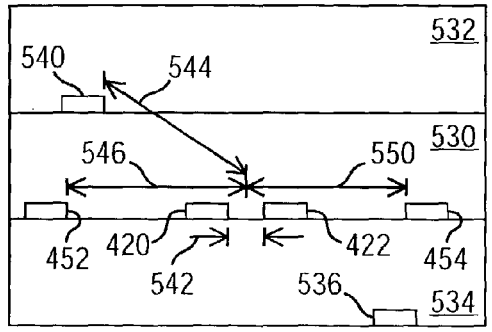
FIGS. 25A–25E are cross-sectional end views of three layers in an exemplary circuit layout, looking into the end of a target differential line pair segment, illustrating adjusted cross-sectional properties of the target differential line pair segment to adjust impedance.

Adjustments to line segments were shown in FIGS. 19A–19D with a top view illustration. To further aid understanding of adjustments to line segments, the adjustments made to a differential line pair by the differential line pair impedance adjustment tool will be shown in FIGS. 25A–25E with an end view of a cross-section through the circuit. FIG. 25A shows a cross-section including three layers, a target layer 530, an upper layer 532, and a lower layer 534. Referring for a moment to FIGS. 21 and 25A simultaneously, a partial end view of a target layer 530 is illustrated in FIG. 25A, a portion 402 of which is shown in FIG. 21 in a top view. When looking at FIG. 21, the cross-section of FIG. 25A is taken at the left end of the differential line pair 420 and 422, looking to the right at the ends of the differential line pair 420 and 422.

The target layer 530 shown in FIG. 25A contains the individual traces 420 and 422 of the differential line pair and neighboring lines 452 and 454. The lower layer 534 contains a signal line 536. The upper layer 532 contains a ground line 540 that is unmovable in this example, being part of a ground grid.

Various cross-sectional properties of the differential line pair 420 and 422 may be adjusted by the differential line pair impedance adjustment tool. The distance or separation 542 between the differential line pair traces 420 and 422 may be varied. The distance 544 between the differential line pair 420 and 422 and the ground line 540 on the upper layer 532 may be varied. The distances 546 and 550 between the differential line pair 420 and 422 and its neighboring lines 452 and 454, respectively, may also be varied. Changing one of these cross-sectional properties is likely to affect the others as well, and the way in which the cross-sectional properties are varied depends on the impedance goals set by the designer 14 and on the impedance optimization algorithm.

Figure 25B:
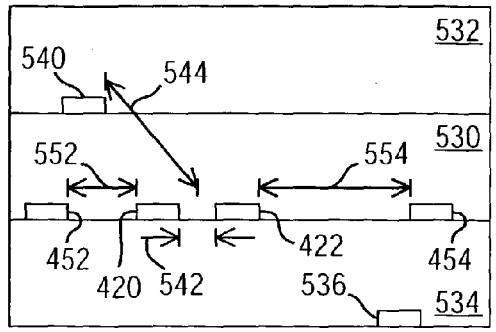

One exemplary adjustment to the cross-sectional properties of the differential line pair 420 and 422 is illustrated in FIG. 25B. The differential line pair 420 and 422 has been shifted to the left, reducing the distance 544 between it and the ground line 540 on the upper layer 532. Although the separation 542 between the traces 420 and 422 of the differential line pair has not been changed, note that the shift to the left reduced a distance 552 between the left trace 420 and its neighboring line 452 and increased a distance 554 between the right trace 422 and its neighboring line 454.

Figure 25C:
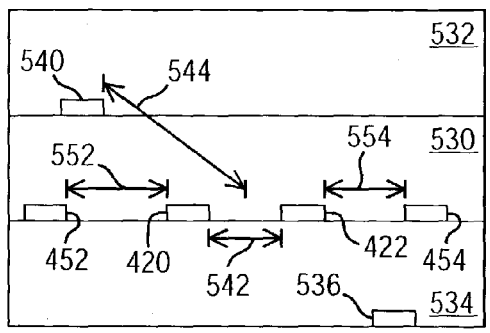

Another exemplary adjustment to the cross-sectional properties of the differential line pair 420 and 422 is illustrated in FIG. 25C. The separation 542 between the traces 420 and 422 in the differential line pair has been increased, but the distance 544 between the center of the differential line pair 420 and 422 and the ground line 540 on the upper layer 523 has not been changed. The increase in separation 542 between the traces 420 and 422 in the differential line pair decreases both the distance 552 between the left trace 420 and its neighboring line 452 and the distance 554 between the right trace 422 and its neighboring line 454. This illustrates the desirability of considering both the odd mode characteristic impedance of the differential line pair 420 and 422 and the balance between the individual characteristic impedances of the traces 420 and 422 in the differential line pair. If the separation 542 is increased to adjust the odd mode characteristic impedance, it shifts the traces, possibly changing the balance between the individual characteristic impedances of the traces 420 and 422 in the differential line pair.

Figure 25D:
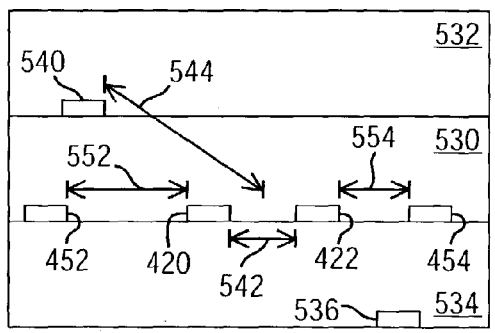

Another exemplary adjustment to the cross-sectional properties of the differential line pair 420 and 422 is illustrated in FIG. 25D. In this adjustment, the right trace 422 of the differential line pair 420 and 422 has been shifted to the right, decreasing the distance 554 between the right trace 422 and its neighboring line 454, and increasing the separation 542 between the traces 420 and 422 in the differential line pair. Although the distance 552 between the left trace 420 and its neighboring line 452 remains unchanged, this adjustment increases the distance 544 between the center of the differential line pair 420 and 422 and the ground line 540 on the upper layer 532. This illustrates the multiple variables to consider when shifting the traces 420 and 422 of the differential line pair. As the individual positions of each trace 420 and 422 are varied, the separation between them may change and the distance to neighboring lines may change, affecting both the odd mode characteristic impedance and the balance between the individual characteristic impedances of the traces 420 and 422 in the differential line pair.

Figure 25E:
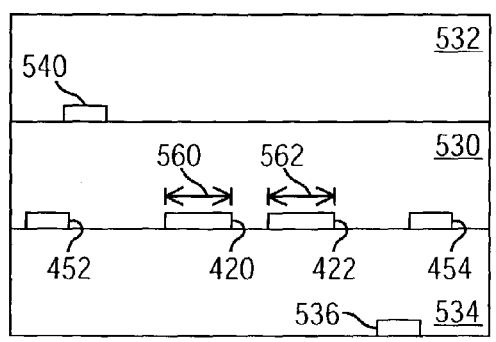

Finally, if the desired impedance values cannot be achieved by changing the position of the differential line pair 420 and 422, an alternative embodiment of the differential line pair impedance adjustment tool may alter the width of the traces 420 and 422 in a differential line pair segment, as illustrated in FIG. 25E. In this alternative embodiment, the widths 560 and 562 of the traces 420 and 422 have been increased. The positions of the traces 420 and 422 may be adjusted as needed after changing the line widths to try to correct or minimize the impedance error and to achieve the goals specified by the designer 14.

Figure 26:
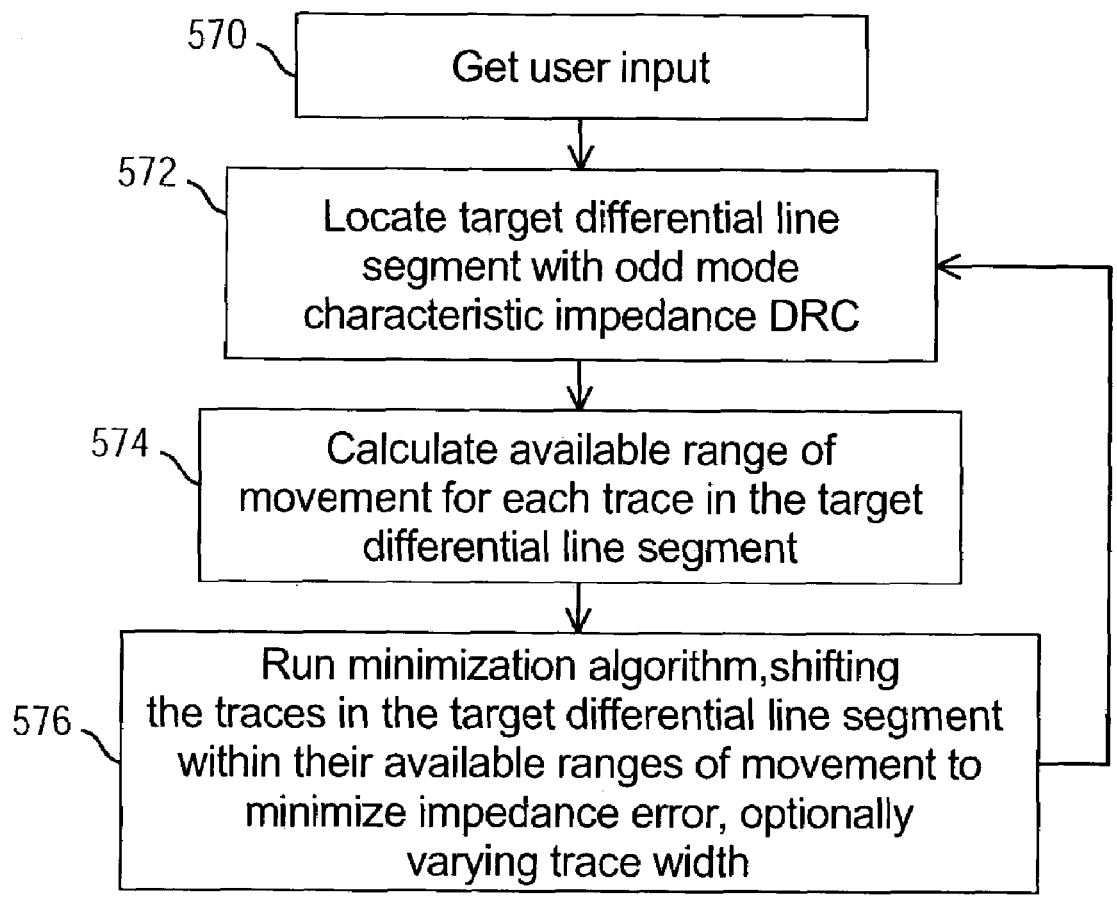
FIG. 26 is a flowchart summarizing an exemplary operation for adjusting differential line pair impedance.

The operation of the differential line pair impedance adjustment tool is illustrated in the flowchart of FIG. 26. User input is obtained 570 as in the differential line pair impedance verification tool described above, such as the following:

Target differential nets
Layers on which impedance will be adjusted for target differential nets
Window definition (such as the perpendicular distance from the target differential line pair segment and the number of layers to consider above and below the target layer when recalculating impedance)
Desired odd mode characteristic impedance or tolerance
Weight to be given to equalizing characteristic impedances of individual traces in the differential line pair
Material properties This information may be stored by the differential line pair impedance verification tool in the design database or elsewhere, or may be entered by the designer 14. A differential line pair segment with an impedance error is located 572, and the available ranges of movement for each trace in the target differential line pair segment may be calculated 574. Alternatively, acceptable placement for the traces in the target differential line pair segment may be determined dynamically as new positions are tried.

A one-dimensional minimization algorithm is executed 576 to locate the best positions for the traces in the target differential line pair segment, correcting or minimizing the odd mode characteristic impedance error and equalizing the characteristic impedances of the individual traces according to the priority specified by the designer 14 in the input. The algorithm shifts the traces in the target differential line pair segment to a number of trial locations within the available range or within a specified window (e.g., 462, FIG. 22). The algorithm is one-dimensional because it shifts the traces in the target differential line pair segment from side to side only on their own layer, not up and down to other layers in the circuit. At each trial location, the odd mode characteristic impedance of the target differential line pair segment is recalculated. Optionally, the characteristic impedances of the individual traces in the target differential line pair segment may also be calculated and compared, if some weight has been given to equalizing those values. The impedance values may be calculated in the same manners as described above with respect to the differential line pair impedance verification tool (for the odd mode characteristic impedance calculation) and the signal line impedance verification tool (for the individual trace characteristic impedance calculations).

The exemplary one-dimensional minimization algorithm used by the differential line pair impedance verification tool may be multi-variate to adjust both the odd mode characteristic impedance of the target differential line pair segment and the characteristic impedances of the individual traces in the target differential line pair segment. In this exemplary minimization algorithm, the expression to be minimized may be as follows:

$$A(Z_{odd\ target} - Z_{odd\ calculated}) + B(Z_{0\ target} - Z_{0\ calculated})$$
$$= \text{tolerance}$$

where A is the weight from 0 to 1 given to optimizing the odd mode characteristic impedance of the differential line pair and B is the weight from 0 to 1 given to optimizing the characteristic impedance of a trace in the differential line pair. (A third term in the expression may be added for the characteristic impedance of the second trace in the differential line pair.)

The differential line pair impedance adjustment tool enables the designer 14 to rapidly and accurately control the odd mode characteristic impedance of a differential line pair and control and balance the characteristic impedances of individual traces in the differential line pair.

Differential Via Pair Impedance Verification Tool

The differential via pair impedance verification tool verifies the odd mode characteristic impedance of specified differential via pairs in a circuit design database. As discussed above, this design database may comprise layout information containing the names, sizes, location and layer, etc., of differential via pairs that carry signals in the electrical circuit. The design database also contains information about ground vias and other elements in the circuit. The design database may be created by EDA software for logical circuit design followed by EDA software for physical circuit layout such as the APD package designer.

In this exemplary embodiment, the differential via pair impedance verification tool runs on top of the EDA software 12 as a script. For example, if the EDA software 12 comprises the APD package designer, the differential via pair impedance verification tool may be implemented as a script using the "Skill" scripting language and executed within the APD design environment. In this example, the circuit model access commands issued by the differential via pair impedance verification tool may comprise Skill commands issued to the APD package designer. Alternatively, the differential via pair impedance verification tool may be implemented as a standalone software application or as a script in another language such as Perl, as desired or as needed to operate with other EDA software.

The differential via pair impedance verification tool calculates the odd mode characteristic impedance of one or more differential via pairs in the design database and compares the calculated odd mode characteristic impedance against the desired impedance. If a calculated odd mode characteristic impedance differs from the desired impedance or is not within a desired tolerance, the error is flagged for later correction.

Although verifying the characteristic impedance of each individual via in the differential via pair may also be of interest, the differential via pair impedance adjustment tool calculates only the odd mode characteristic impedance of the differential via pair, because the signal via impedance verification tool may be used to verify the characteristic impedance of the individual vias.

Figure 27:
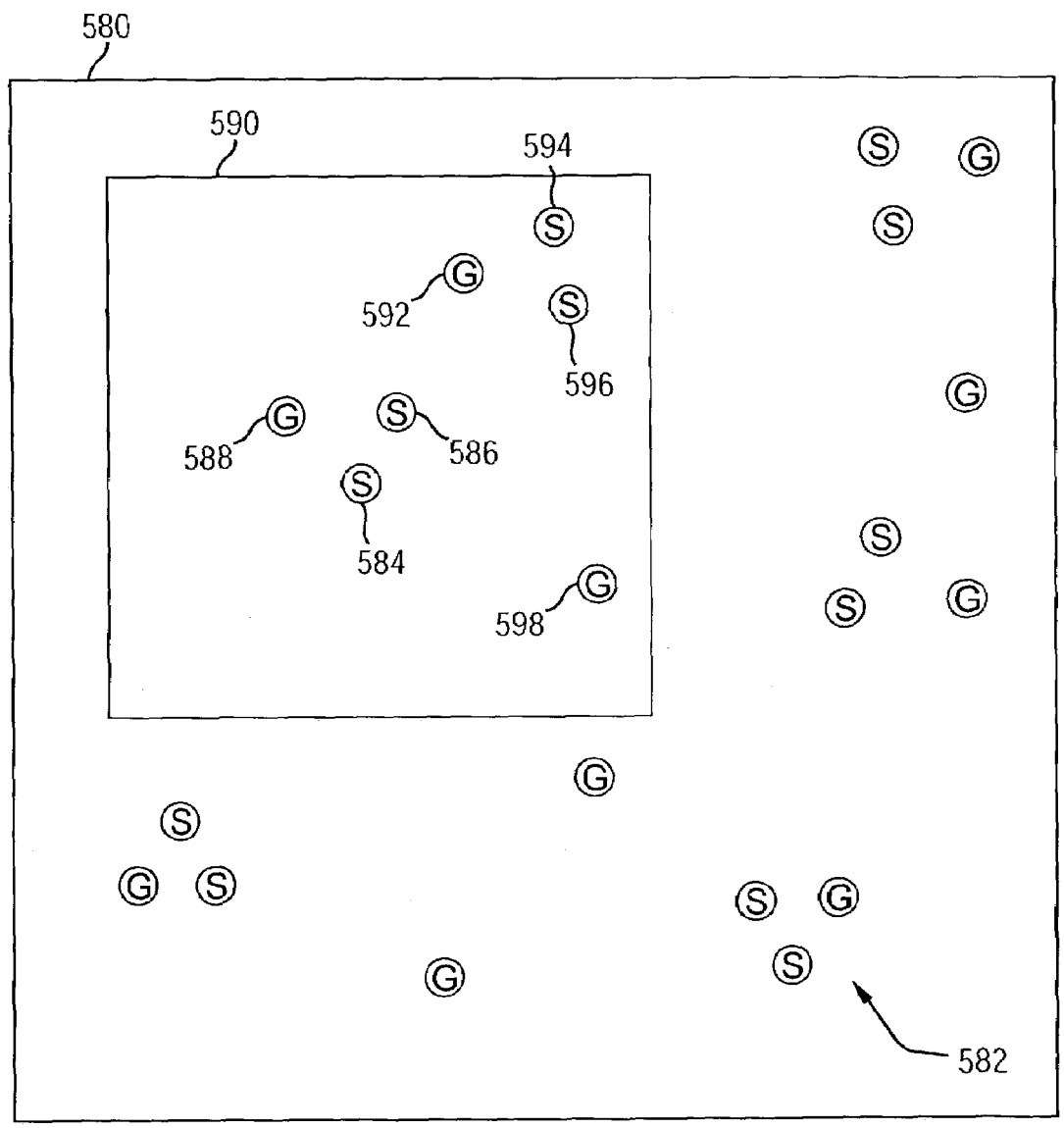
FIG. 27 is a top view of a portion of a layer in an exemplary circuit illustrating a target differential via pair for which impedance will be verified.

Referring now to FIG. 27, a portion of an exemplary circuit layout is shown to illustrate the operation of the differential via pair impedance verification tool. (Only vias are shown in this view to simplify the drawing and explanation, omitting traces and other elements.) Note that the placement of signal and ground vias in FIG. 27 is purely exemplary and is not intended to represent an actual circuit layout or to limit the differential via pair impedance verification tool disclosed herein.

In this exemplary embodiment, the impedance calculations made by the differential via pair impedance verification tool take into account parameters from a single layer only, so FIG. 27 is a top view of a single layer 580. The layer 580 contains multiple vias 582 including at least one differential via pair (e.g., 584 and 586). Differential via pairs typically include a pair of vias (e.g., 584 and 586) that carry signals during circuit operation, and are marked with an "S" in FIG. 27 (e.g., 584). Differential via pairs may be operated in either odd mode or even mode. In odd mode operation, the vias (e.g., 584 and 586) in the differential via pair are driven with opposite polarities of the same signal. In even mode operation, the vias (e.g., 584 and 586) in the differential via pair are driven with the same signal. The differential via pair impedance verification tool may be adapted for use with vias operating in any mode, although the exemplary embodiment described herein calculates the odd mode characteristic impedance for differential via pairs driven in odd mode. Ground vias may also be placed near the differential via pairs to provide a return path to an electrical ground such as a ground plane (e.g., 82 or 90, FIG. 3) and are marked with a "G" in FIG. 27 (e.g., 588).

Figure 28:
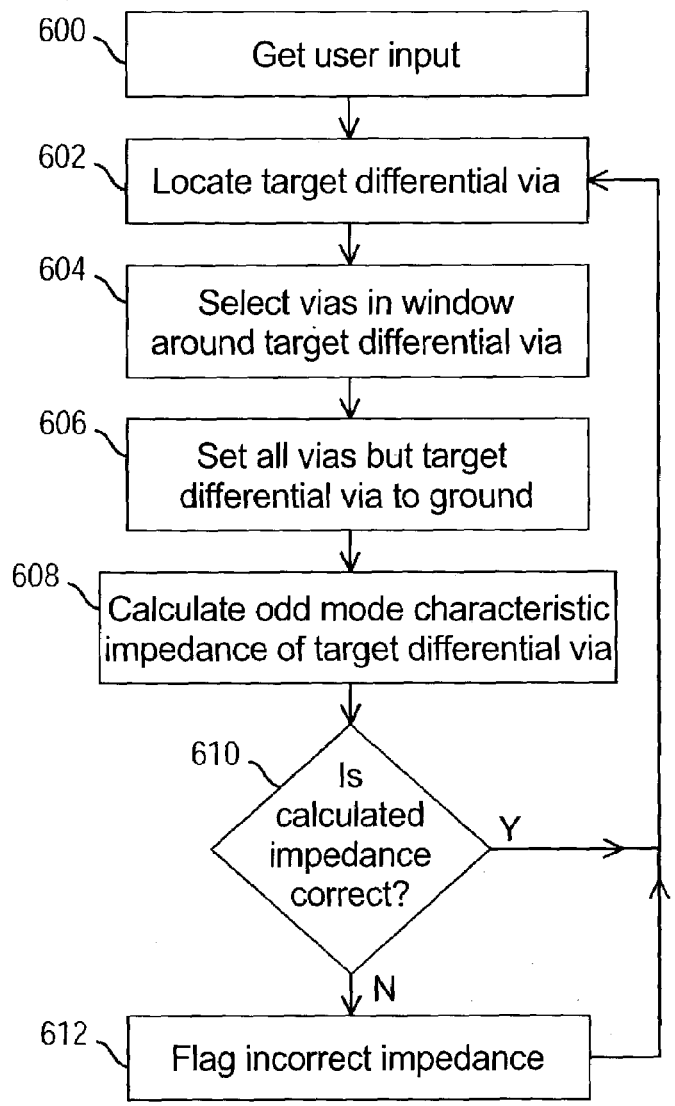
FIG. 28 is a flowchart summarizing an exemplary operation for verifying the odd mode characteristic impedance of differential via pairs.

Operation of the differential via pair impedance verification tool will now be described with reference to the circuit layout of FIG. 27 and the flowchart of FIG. 28. The flowchart of FIG. 28 illustrates the operation of the differential via pair impedance verification tool. The differential via pair impedance verification tool obtains 600 any needed user input that is not hard-coded into the tool. The inputs used by the differential via pair impedance verification tool depend upon the technique used in calculating impedance. For example, the following items may be entered as user input in the present exemplary embodiment:

Target differential via pairs
Window size
Desired odd mode characteristic impedance or tolerance
Material properties The target differential via pairs are those differential via pairs for which odd mode characteristic impedance will be calculated. This input may be entered in any desired manner, such as the name of the differential via pair or the individual vias making up the differential via pair in the design database, or the name of the net of which the differential via pair is a part and the layers on which differential via pairs in a specified net will be examined, or all differential via pairs in the design database, or all differential via pairs on specified signals, etc.

The window size determines the scope of the impedance calculation. When calculating odd mode characteristic impedance of a target differential via pair, one of the factors considered is the effect of neighboring vias on the odd mode characteristic impedance of the target differential via pair. As the distance increases between the target differential via pair and neighboring vias, the effect of the neighboring vias on the target differential via pair's odd mode characteristic impedance decreases. Therefore, the designer 14 may specify a window 590 to limit the area in which neighboring vias are considered in the impedance calculation for a target differential via pair. In the circuit layout illustrated in FIG. 27, seven vias 584, 586, 588, 592, 594, 596 and 598 are located in the window 592. All other vias on the layer 580 are outside the window 590 and are therefore excluded from the odd mode characteristic impedance calculation.

The window size of the exemplary embodiment is specified as a size around the target differential via pair (e.g., 584 and 586). (Although the window 590 is shown as square in FIG. 27, the window 590 may have any shape, such as circular.) Thus, for each target differential via pair (e.g., 584 and 586), the window is centered around the target differential via pair (e.g., 584 and 586). Alternatively, the window location and dimensions may be specified for a given target differential via pair.

Note that in this exemplary embodiment, the impedance calculations for a differential via pair take into account only parameters from a single layer, so the window is limited to a single layer as well. However, the differential via pair impedance verification tool is not limited to any particular means for controlling the scope of the impedance calculation.

The desired odd mode characteristic impedance for one or more target differential via pairs may also be entered, either as an exact odd mode characteristic impedance value or as an acceptable tolerance around a desired odd mode characteristic impedance value.

The designer 14 may also specify the material properties, such as the dielectric constant or electric permittivity epsilon and the magnetic permeability mu, if needed for the impedance calculation and if not hard-coded into the signal via impedance verification tool. The material properties are the characteristics of the material in which the vias are embedded, such as the substrate of the IC or PCB.

Having any needed inputs, the differential via pair impedance verification tool locates 602 the first target differential via pair (e.g., 584 and 586) for which odd mode characteristic impedance is to be calculated. The other vias 588, 592, 594, 596 and 598 are located in the window 590 on the layer 580 are selected 604 and are set 606 to ground. Note that in this example, three vias 588, 592 and 598 are ground vias, so the remaining neighboring signal vias 594 and 596 are set 606 to ground for the odd mode characteristic impedance calculation.

With this information, the differential via pair impedance verification tool calculates 608 the odd mode characteristic impedance $Z_{odd}$ of the target differential via pair 584 and 586. The calculated odd mode differential impedance is compared 610 with the desired value, and if the calculated odd mode differential impedance is incorrect or does not fall within the specified tolerance, the target differential via pair 584 and 586 is flagged 612 as having an incorrect odd mode characteristic impedance.

The target differential via pair 584 and 586 may be flagged 612 in any desired manner, as discussed above. For example, the differential via pair impedance verification tool may indicate the error directly to the designer 14, may store a list of impedance errors separately, may place a DRC directly in the circuit design database, or may indicate the error to the EDA software 12, etc., as desired. If the design database includes an entry for the differential via pair, the DRC may be placed in that entry. Alternatively, the DRC may be placed as needed to identify the differential via pair 584 and 586 having the odd mode characteristic impedance error, such as in the entries for the individual vias making up the differential via pair. The type of impedance error should be indicated with the DRC to differentiate between characteristic impedance errors for a signal via and odd mode characteristic impedance errors for a differential via pair that includes the individual signal via, particularly when the $Z_{odd}$ DRC is placed in the design database entry for an individual via.

The parameters used to calculate the odd mode characteristic impedance that led to a DRC may also be stored for use by the differential via pair impedance adjustment tool.

After the odd mode characteristic impedance is calculated 608 and verified 610 for the target differential via pair 584 and 586 and any errors have been flagged 612, the next target differential via pair may be located 602 and the process repeated until all desired differential via pairs have checked.

Figure 29:
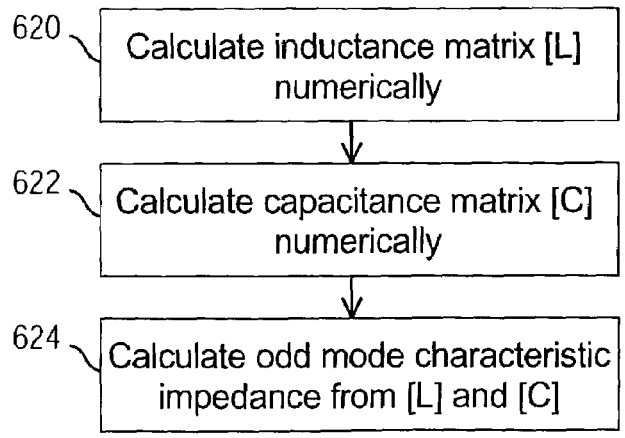
FIG. 29 is a flowchart summarizing an exemplary odd mode characteristic impedance calculation in an embodiment of the differential via pair impedance verification tool.

Referring now to FIG. 29, the odd mode characteristic impedance calculation in the exemplary differential via pair impedance verification tool will be described in more detail. The inductance matrix [L] of the target differential via pair 584 and 586 is calculated 620 numerically using any suitable technique, such as a finite element routine, or using a generic analytical field solver. The capacitance matrix [C] of the target differential via pair is then calculated 622 numerically from the inductance matrix using a formula such as [C]= $(\mu_0\epsilon_0\mu_0\epsilon_0)/[L]$, where the inductance and capacitance matrices may be represented as follows:

$$[L] = \begin{bmatrix} L_{11} & L_{12} \\ L_{21} & L_{22} \end{bmatrix} \quad [C] = \begin{bmatrix} C_{11} & C_{12} \\ C_{21} & C_{22} \end{bmatrix}$$

Alternatively, the capacitance matrix [C] may be calculated first, followed by the inductance matrix [L]. The odd mode characteristic impedance $Z_{odd}$ is then calculated 624 as follows:

$$Z_{odd} = 2\sqrt{\frac{L_{11} + L_{22} - 2L_{12}}{C_{11} + C_{22} + 2C_{12}}}$$

The differential via pair impedance verification tool makes it simple for the designer 14 to verify the odd mode characteristic impedance of numerous differential via pairs in even complex circuit designs, thereby flagging incorrect impedance values that may lead to errors in the circuit.

Differential Via Pair Impedance Adjustment Tool

Once impedance errors are flagged in a suitable manner, such as in the design database or in a separate file, a differential via pair impedance adjustment tool may be invoked to resolve odd mode characteristic impedance DRCs by correcting or minimizing the impedance error of a differential via pair. The differential via pair impedance adjustment tool may be implemented in any suitable manner, such as in a Skill script for use within the APD package designer. The differential via pair impedance adjustment tool uses a recursive algorithm to vary via properties in a window around the target differential via pair, including the position of a ground via near the target differential via pair, spacing between the vias in the differential via pair, and diameter of the vias in the differential via pair. The ground via to be adjusted typically serves as a return path for the differential via pair, but the differential via pair impedance adjustment tool is not limited to this configuration. The positions of the ground via and individual vias in the differential via pair are adjusted within a restricted spatial arrangement to better match the desired odd mode characteristic impedance of the transmission line formed by the differential via pair and the return path ground via, and to better match the desired characteristic impedance of each individual via in the differential via pair. The odd mode characteristic impedance and individual characteristic impedances may be calculated using either closed form formulae, a generic field solver, or a lookup table, etc. If an exact match to the desired impedances does not exist within the restricted spatial arrangement, the differential via pair impedance adjustment tool will attempt to minimize the impedance errors by locating the best possible properties for the vias in the window.

Note that if one or more individual vias in a differential via pair were flagged with characteristic impedance errors, but the differential via pair did not have an odd mode characteristic impedance error, the designer 14 may wish to use the differential via pair impedance adjustment tool instead of the signal via impedance adjustment tool. This is because the differential via pair impedance adjustment tool can monitor the odd mode characteristic impedance of the differential via pair while adjustments are being made to correct the individual characteristic impedances, thereby keeping the odd mode characteristic impedance correct. In contrast, the signal via impedance adjustment tool could be used to correct the individual characteristic impedances, but in the process, it may alter the odd mode characteristic impedance of the overall differential via pair.

The spatial arrangement for ground vias and vias in the target differential via pair are restricted by identifying acceptable locations in which the vias may be placed, as described with respect to the signal via impedance adjustment tool above. For example, a grid may be established in the window (as illustrated in FIG. 9), and each grid location may be marked as suitable or not for a particular via.

Figure 30A:
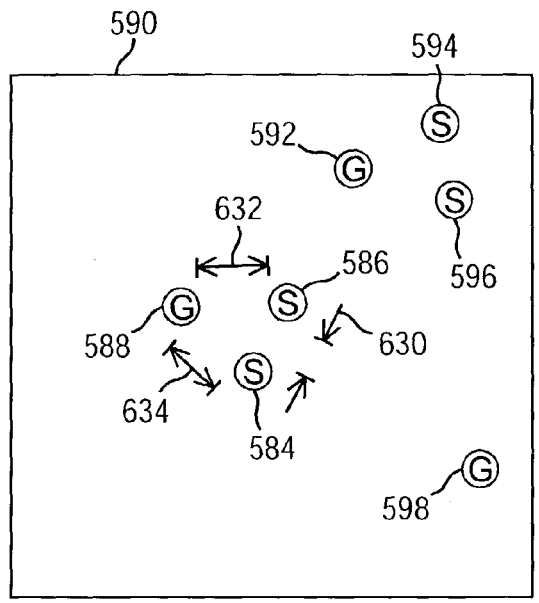
FIGS. 30A–30C are top views of a portion of a layer in the exemplary circuit layout of FIG. 27, illustrating adjusted positions of a differential via pair and a corresponding ground via to adjust the odd mode characteristic impedance of the differential via pair and the characteristic impedance of each individual via.
Figure 30B:
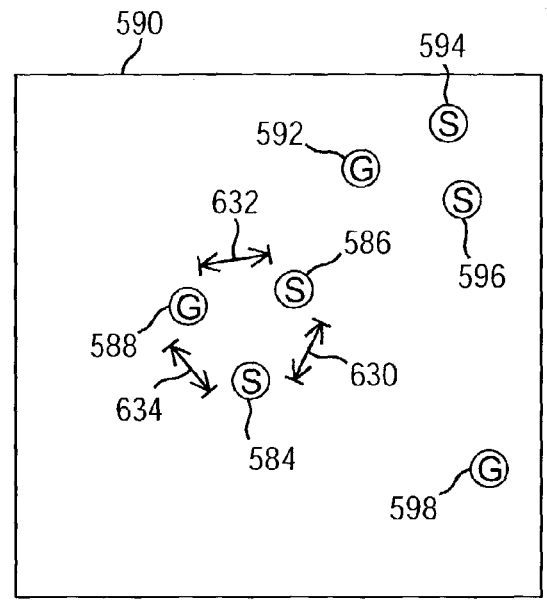
Figure 30C:
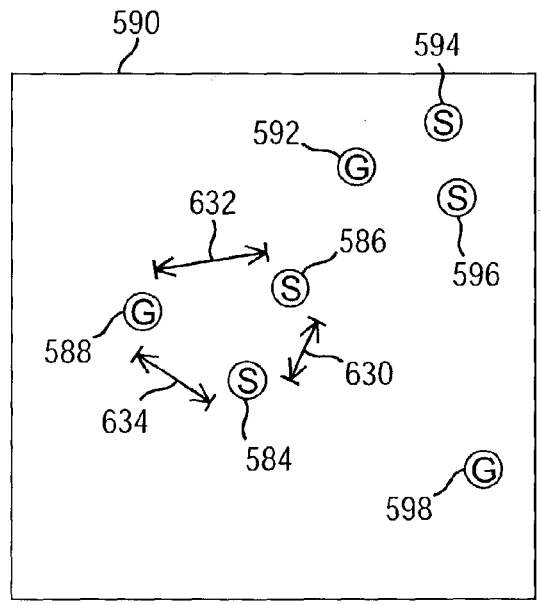

Exemplary adjustments to via positions in a window are illustrated in FIGS. 30A–30C. A window 590 is established with the target differential via pair (e.g., 584 and 586) centered therein, and the possible spatial arrangement for the vias is restricted by calculating the available range of movement for the vias. As described above, the available range of movement may either be calculated explicitly in advance, or a multi-dimensional minimization algorithm used by the differential via pair impedance adjustment tool may check for forbidden placement of vias later during the impedance correction process.

FIG. 30A illustrates the exemplary circuit layout of FIG. 27 lying within the window 590. All vias are shown in their original position, including the target differential via pair 584 and 586, the ground via 588 providing the current return path for the target differential via pair 584 and 586, and other neighboring vias 592, 594, 596 and 598. A distance 630 is shown for the separation between the vias 584 and 586 of the target differential via pair. Distances 632 and 634 are also shown between the return path ground via 588 and the vias 586 and 584, respectively, of the differential via pair.

In FIG. 30B, the separation 630 between the vias 584 and 586 of the target differential via pair has been increased in an attempt to adjust the odd mode characteristic impedance of the target differential via pair 584 and 586. However, the distances 632 and 634 between the return path ground via 588 and the vias 586 and 584 of the differential via pair have been kept unchanged. Distances between other neighboring vias 592, 594, 596 and 598 and the target differential via pair 584 and 586 changed with this adjustment and will affect the recalculation of the odd mode characteristic impedance and individual characteristic impedances of the target differential via pair 584 and 586.

In FIG. 30C, the position of the return path ground via 588 has also been changed, in an attempt to adjust the individual characteristic impedances of the vias 584 and 586 in the target differential via pair. The distances 632 and 634 between the return path ground via 588 and the vias 586 and 584 of the differential via pair have both been increased, one 632 more than the other 634.

The differential via pair impedance adjustment tool may also adjust the diameter of vias in the window 590, particularly of the vias 586 and 584 in the differential via pair, as needed to adjust the odd mode characteristic impedance and individual characteristic impedances.

After the properties of vias in the window 590 have been adjusted, re-verification of impedances may be needed, as described above. In addition, traces connected to shifted vias are moved or otherwise adjusted by the differential via pair impedance adjustment tool to connect to the shifted vias.

As described above with respect to the differential line pair impedance adjustment tool, the odd mode characteristic impedance adjustment to the target differential via pair may be balanced with the individual characteristic impedance adjustments to the vias in the target differential via pair. This enables the designer 14 to give priority to adjusting the odd mode characteristic impedance or to the individual characteristic impedances or to the equality of the individual characteristic impedances, as desired. This feature is included in the differential via pair impedance adjustment tool because it may often be the case that exact desired impedances cannot be achieved in a given circuit layout, so the designer 14 is allowed to indicate which impedance value should be optimized most.

Figure 31:
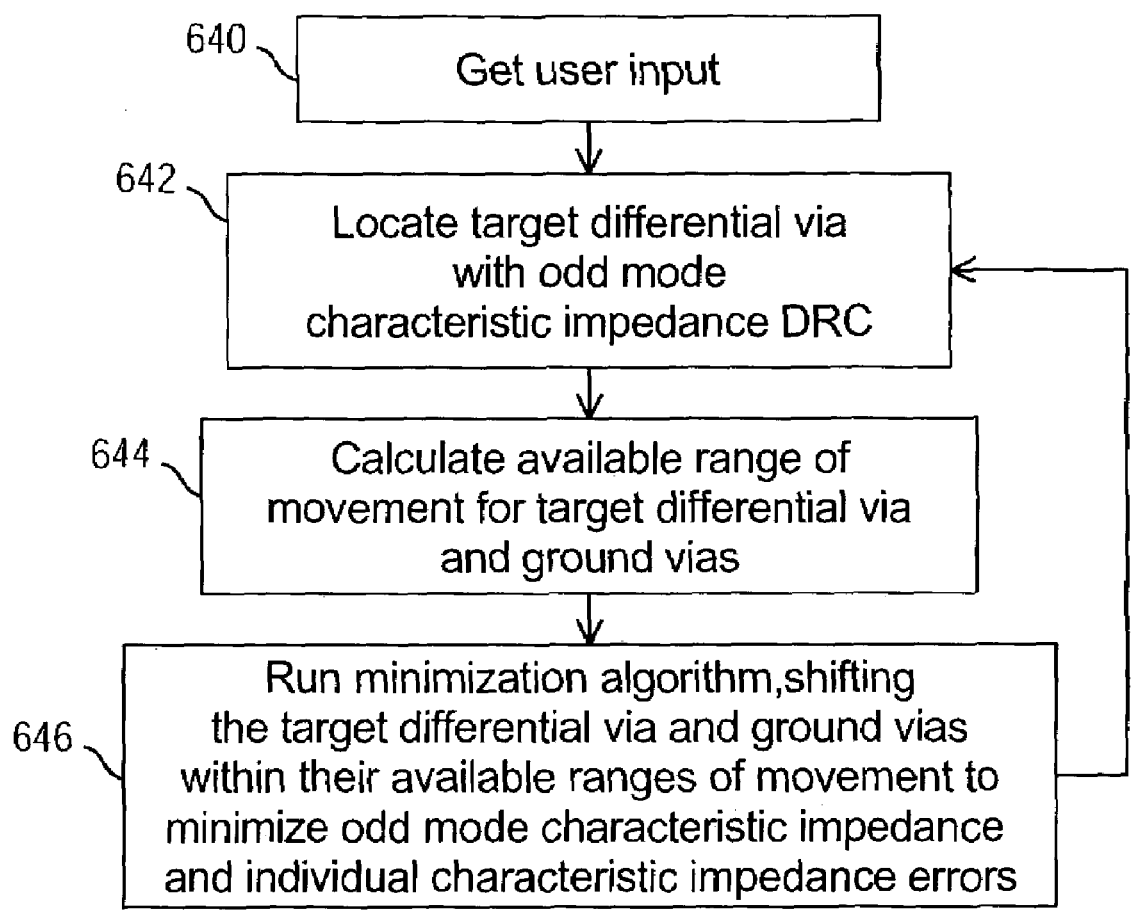
FIG. 31 is a flowchart summarizing an exemplary operation for adjusting differential via pair impedance.

The operation of the differential via pair impedance adjustment tool is illustrated in the flowchart of FIG. 31. User input is obtained 640 as in the differential via pair impedance verification tool described above, such as the following:

Target differential via pairs
Window size
Desired odd mode characteristic impedance or tolerance
Weight to be given to level or equality of characteristic impedances of individual vias in the differential via pair
Material properties This information may be stored by the differential via pair impedance verification tool in the design database or elsewhere, or may be entered by the designer 14. A differential via pair with an impedance error is located 642 (or a differential via pair including at least one individual via having a characteristic impedance DRC). The available ranges of movement for each via in the target differential via pair and neighboring vias may be calculated 644. Alternatively, acceptable placement for the vias in the window 590 may be determined dynamically as new positions are tried.

A two-dimensional minimization algorithm is executed 646 to locate the best properties for the vias in the window 590, adjusting the separation in the differential via pair, distances to neighboring vias, and via diameters as needed to correct or minimize the odd mode characteristic impedance error and adjust or equalize the characteristic impedances of the individual vias according to the priority specified by the designer 14 in the input. After each trial adjustment, the odd mode characteristic impedance of the target differential via pair is recalculated. Optionally, the characteristic impedances of the individual vias in the target differential via pair may also be calculated and compared, if some weight has been given to equalizing or controlling those values. The impedance values may be calculated in the same manners as described above with respect to the differential via pair impedance verification tool (for the odd mode characteristic impedance calculation) and the signal via impedance verification tool (for the individual via characteristic impedance calculations).

The impedance verification and adjustment tools described above enable a designer to quickly, easily and accurately control impedance values in a circuit design during the circuit design process. Although each tool has been described separately above, it is noted that there is some overlap, and much of what is explained for one tool is relevant to the other tools described herein.

Each computer program within the scope of the claims below may be implemented in any programming language, such as machine language, assembly language, or high-level languages such as C or C++. The computer programs may be interpreted or compiled.

Each computer program may be tangibly embodied on a computer-executable storage medium for use by a computer processing system. Methods claimed below may be performed by a computer processing system executing a computer program tangibly embodied on a storage medium to perform functions described above by operating on input and generating output. The computer processing system may be either a general purpose or special purpose processor, such as a microprocessor or application-specific integrated circuit (ASIC).

Storage media for tangibly embodying computer program instructions include, for example, magnetic or optical disks, both fixed and removable, semiconductor memory devices such as memory cards and read-only memories (ROMs), including PROM's, EPROM's, EEPROM's, etc. Storage media for tangibly embodying computer program instructions also include printed media such as computer printouts on paper which may be scanned, parsed, and executed by a computer processing system. The computer program instructions may also be tangibly embodied as an electrical signal in a transmission medium such as the Internet or other types of networks, both wired and wireless.

While illustrative embodiments of the invention have been described in detail herein, it is to be understood that the inventive concepts may be otherwise variously embodied and employed, and that the appended claims are intended to be construed to include such variations, except as limited by the prior art.

The perl script for the signal via impedance verification tool described above is as follows:

```
#!/opt/per15/bin/perl
# Calculate characteristic impedance of vias
# from an APD database
require 5.004;
require 'getopts.pl';
use English;
use POSIX;
$opt_t=0.1;
&Getopts("t:");
if(@ARGV !=3) {
    print STDERR "Usage: $0 [-t Z0_tolerance] Z0 adp_file report file\n";
    print STDERR "t: sets Z0 tolerance, defaults to 0.10 (or 10%)\n";
    exit;
}
$tolerance=$opt_t;
$Z0_target=$ARGV[0];
$input_file=$ARGV[1];
$output_file=$ARGV[2];
# open source file generated by APD
open (SOURCE, "<$input_file") || die "Couldn't open: $!\n";
open (OUTPUT, ">$output_file") || die "Couldn't open: $!\n";
```

```
# Read in paragraph mode
$/=" ";
# Read in all sets of via fields (includes signal via,
# ground via, and simulation window)
while (defined($para=<SOURCE>)) {
   chomp($para);
   push(@data_record,$para);
}
$min=($Z0_target-($Z0 target*$tolerance));
$max=($Z0_target+($Z0_target*$tolerance));
foreach $entry (@data_record) {
   my($target_line,$Z0);
   ($target_line,$layer)=create_raphael_file($entry);
   if (system("raphael rc2-z -x -n data>temp 2>err")!=0)
   last;
   }
   $Z0=read_Z0($target_line);
   $target_line=~/_/;
   if (($Z0<$min)|($Z0>$max)) }
      print "Signal $', layer=$layer, Zo=$Z0, NOT in
         spec\n";
      printf (OUTPUT "$'\t$layer\tZo=%3.4f\n",$Z0);
   }
}
close(SOURCE);
close(OUTPUT);
sub create_raphael_file
   local ($data_set)=@_;
   my(@gnd_list,$field,$info,$gnd_count,$sig_name);
   open (DATAOUT, ">data") || die "Couldn't open: $!\n";
   % data_record=split(/[\t\n]/,$data_set);
   @gnd_list=( );
   while (($field,$info)=each % data_record)
      if ($field=~/sig|SIG/) {
         $sig_name=$field;
         @data=split(/\s+/,$info);
         printf (DATAOUT "circ1 name=$field; cx=% f;
            cy=% f; r=% f; volt=1.0;\n",
            $data[0],$data[1],$data[2]);
      } elsif ($field=~/gnd|GND|ground|GROUND/) {
         $gnd_count+=1;
         @data=split(/\s+/,$info);
         printf (DATAOUT "circ1 name=gnd_$gnd_count;
            cx=% f; cy=% f; r=% f; volt=0.0;\n",
            $data[0],$data[1],$data[2]);
         push(@gnd_list,"gnd_$gnd_count");
      { elsif ($field=~/window/)}
         @data=split(/\s+/,$info);
         printf (DATAOUT "window diel=% f; x1=% f;
            y1=% f; x2=% f; y2=% f;\n",
            $data[0],$data[1],$data[2],$data[3],$data[4]);
         $layer=$data[5];
      }
   }
   printf (DATAOUT "merge % s;\n",join(';',@gnd_list));
   printf (DATAOUT "options iter_tol=1e-5;
set_grid=10000; fac_regrid=1.414; max_regrid=5;
regrid_tol=0.5; unit=1e-6;\n");
   printf (DATAOUT "z0 $sig_name;\n");
   close(DATAOUT);
   return ($sig_name,$layer);
}
sub read_Z0 {
   local($target_line)=@_;
   my($line,$Z0);
   open (Z0_INFO, "<data.out") || die "Couldn't open:
      $!\n";
   while($line=<Z0_INFO>) {
      if ($line=~/Z0 of $target_line=(.*)/) {
         $Z0=$1;
      }
   }
   close(Z0_INFO);
   return $Z0;
}
```

What is claimed is:

1. A computer-implemented method for adjusting impedance, comprising:
   searching through a list of differential line pairs in a circuit design database for a target differential line pair, said target differential line pair being flagged as having an incorrect characteristic impedance; and
   adjusting a position in a circuit layout described in said circuit design database of at least one line in said differential line pair to correct said characteristic impedance.

2. The method of claim 1, said adjusting comprising adjusting an odd mode characteristic impedance of said target differential line pair.

3. The method of claim 1, said adjusting comprising adjusting an odd mode characteristic impedance of said target differential line pair and a characteristic impedance of at least one line in said differential line pair.

4. The method of claim 1, said adjusting comprising shifting said at least one line in said differential line pair from side to side.

5. The method of claim 1, further comprising adjusting at least one conductor connected to said at least one line so that electrical connections to said differential line pair are not disrupted by said adjustment to said position.

6. The method of claim 1, said adjusting comprising executing a minimization algorithm to identify a best position for said at least one line in said differential line pair, wherein said best position minimizes a difference between said characteristic impedance and a desired characteristic impedance value.

7. The method of claim 6, wherein said characteristic impedance comprises a combination of an odd mode characteristic impedance of said differential line pair and a characteristic impedance of at least one line in said differential line pair.

8. The method of claim 7, further comprising reading a desired weight to give each impedance component in said combination and accordingly performing said weighting during said minimization algorithm.

9. An apparatus for adjusting differential line pair impedance, comprising:
   a. at least one computer readable medium; and
   b. computer readable program code stored on said at least one computer readable medium, said computer readable program code comprising:
      i. program code for reading a desired modal characteristic impedance value for said differential line pair;
      ii. program code for reading properties of said differential line pair from a circuit design database; and
      iii. program code for adjusting a position of said differential line pair in a circuit layout defined in said circuit design database to minimize a difference between a calculated modal characteristic impedance of said differential line pair and said desired modal impedance value.

10. The apparatus of claim 9, said computer readable program code further comprising program code for identifying said differential line pair comprising searching through said circuit design database to locate at least one differential line pair that is flagged with an impedance error.

11. The apparatus of claim 9, said computer readable program code further comprising program code for reading a desired characteristic impedance value for at least one line in said differential line pair, and program code for weighting said adjustment to prioritize said minimization of said difference between said calculated modal characteristic impedance of said differential line pair and said desired modal impedance value and a difference between a calculated characteristic impedance value of said at least one line and said desired characteristic impedance value.

12. The apparatus of claim 9, said computer readable program code further comprising program code for identifying potential adjustments to said differential line pair that would not violate design constraints.

13. The apparatus of claim 12, said computer readable program code further comprising program code for replacing said difference with a high error value for any potential adjustments that would violate design constraints when adjusting said position so that said potential adjustments that would violate design constraints are not selected when minimizing said difference.

14. The apparatus of claim 9, wherein said adjusting said position comprises moving at least one line in said differential line pair from side to side.

15. The apparatus of claim 9, said computer readable program code further comprising program code for adjusting at least one conductive element that was connected to said differential line pair to compensate for said adjusting said position of said differential line pair so that an electrical connection through said differential line pair TV is not broken.

16. The apparatus of claim 9, said computer readable program code further comprising program code for selecting neighboring traces in a window around said differential line pair for use in impedance calculations while adjusting said position of said differential line pair.

17. The apparatus of claim 9, wherein at least a portion of said computer readable program code comprises a script that is executable in a design environment of an electronic design automation application.

18. The apparatus of claim 9, said computer readable program code further comprising program code for reading inputs for controlling said adjusting of said position, wherein said inputs were stored by an impedance verification tool.

19. The apparatus of claim 18, said inputs were stored in said circuit design database.

20. An apparatus for adjusting differential line pair impedance, comprising:
   means for locating a differential line pair in a circuit design database having an incorrect impedance; and
   means for adjusting a position of said differential line pair in a circuit layout defined in said circuit design database to minimize an odd mode characteristic impedance error of said differential line pair.

* * * * *

UNITED STATES PATENT AND TRADEMARK OFFICE
CERTIFICATE OF CORRECTION

PATENT NO. : 6,983,433 B1
APPLICATION NO. : 10/366208
DATED : January 3, 2006
INVENTOR(S) : Mark D. Frank et al.

It is certified that error appears in the above-identified patent and that said Letters Patent is hereby corrected as shown below:

In column 9, line 21, delete "signall;" and insert -- signal1; --, therefor.

In column 25, line 29, delete "hot" and insert -- not --, therefor.

In column 33, line 19, delete "$(\mu_0\varepsilon_0\mu_0\varepsilon_0)$" and insert -- $(\mu_0\varepsilon_0\mu_r\varepsilon_r)$ --, therefor.

In column 36, line 56, delete "10%)" and insert -- 10\%) --, therefor.

In column 37, line 19, delete "}" and insert -- { --, therefor.

In column 37, line 33, after "data_record)" insert -- { --.

In column 37, line 66, delete "(Z0_INFO," and insert -- (ZO_INFO, --, therefor.

In column 40, line 2, in Claim 15, after "pair" delete "TV".

Signed and Sealed this

Twenty-third Day of June, 2009

JOHN DOLL
*Acting Director of the United States Patent and Trademark Office*